US011158079B2

(12) United States Patent
Kwon et al.

(10) Patent No.: US 11,158,079 B2
(45) Date of Patent: Oct. 26, 2021

(54) SUBSTRATE TREATING APPARATUS AND APPARATUS AND METHOD FOR ECCENTRICITY INSPECTION

(71) Applicant: Semes Co., Ltd, Cheonan-si (KR)

(72) Inventors: Ohyeol Kwon, Cheonan-si (KR); Soo Young Park, Incheon (KR); Jihyun Lee, Cheonan-si (KR); Young Ho Choo, Cheonan-si (KR)

(73) Assignee: Semes Co., Ltd., Chungcheongnam-Do (KR)

( * ) Notice: Subject to any disclaimer, the term of this patent is extended or adjusted under 35 U.S.C. 154(b) by 0 days.

(21) Appl. No.: 16/685,345

(22) Filed: Nov. 15, 2019

(65) Prior Publication Data
US 2020/0167946 A1 May 28, 2020

(30) Foreign Application Priority Data

Nov. 23, 2018 (KR) .......................... 10-2018-0145925

(51) Int. Cl.
G06K 9/00 (2006.01)
G06T 7/64 (2017.01)
(Continued)

(52) U.S. Cl.
CPC .............. G06T 7/64 (2017.01); G06T 7/0006 (2013.01); G06T 7/11 (2017.01); G06T 7/13 (2017.01);
(Continued)

(58) Field of Classification Search
CPC ............. G06T 7/13; G06T 2207/10016; G06T 2207/30148; G06T 7/0004;
(Continued)

(56) References Cited

U.S. PATENT DOCUMENTS 6,275,742 B1 * 8/2001 Sagues .................. H01L 21/681
414/936
6,919,913 B1 * 7/2005 Inada ................ H01L 21/67259
348/61
(Continued)

FOREIGN PATENT DOCUMENTS

KR 10-2011-0019243 A 2/2011
KR 20-2014-0002382 U 4/2014
(Continued)

OTHER PUBLICATIONS

Korean Notice of Allowance dated Dec. 18, 2020 issued in corresponding Korean Appln. No. 10-2018-0145925.
(Continued)

Primary Examiner — Shervin K Nakhjavan
(74) Attorney, Agent, or Firm — Harness, Dickey & Pierce, P.L.C.

(57) ABSTRACT

Disclosed are a substrate treating apparatus, an eccentricity inspection apparatus, an eccentricity inspection method, and a recording medium for measuring the amount of eccentricity of a spin chuck. The substrate treating apparatus includes a process chamber, a support unit that supports a substrate and rotates the substrate about a support shaft of a spin chuck, and an eccentricity inspection device that inspects eccentricity of the support shaft. The eccentricity inspection device includes an image acquisition unit that obtains an image of the substrate supported on the support unit and an eccentricity measurement unit that obtains edge data of the substrate from the image of the substrate and measures an amount of eccentricity of the support shaft, based on the edge data.

20 Claims, 18 Drawing Sheets

(51) Int. Cl.
  *G06T 7/13* (2017.01)
  *G06T 7/00* (2017.01)
  *H01L 21/687* (2006.01)
  *G06T 7/11* (2017.01)
(52) U.S. Cl.
  CPC ............... *H01L 21/68792* (2013.01); *G06T 2207/30164* (2013.01)
(58) Field of Classification Search
  CPC ......... G06T 21/67259; G06T 21/67288; H01L 21/68792
  See application file for complete search history.

(56) References Cited

U.S. PATENT DOCUMENTS

| | | | | |
|---|---|---|---|---|
| 7,508,504 | B2* | 3/2009 | Jin | G01N 21/4738 356/237.2 |
| 2004/0042094 | A1* | 3/2004 | Matsuyama | G03F 7/70833 359/822 |
| 2007/0190437 | A1* | 8/2007 | Kaneyama | G03F 7/70925 430/30 |
| 2009/0116727 | A1* | 5/2009 | Jin | G01N 21/9503 382/149 |
| 2011/0054659 | A1* | 3/2011 | Carlson | H01L 21/67253 700/109 |
| 2013/0005056 | A1* | 1/2013 | Kim | H01L 21/681 438/16 |
| 2013/0084393 | A1* | 4/2013 | Kashiyama | H01L 21/67259 427/273 |
| 2014/0124479 | A1* | 5/2014 | Tomita | H01L 21/6708 216/85 |
| 2015/0235368 | A1* | 8/2015 | Kakuma | G06T 7/73 348/135 |
| 2015/0270146 | A1* | 9/2015 | Yoshihara | H01L 21/67103 134/18 |
| 2015/0370175 | A1* | 12/2015 | Nicolaides | G01N 21/9503 355/77 |
| 2016/0091892 | A1* | 3/2016 | Okita | G06T 7/74 700/121 |
| 2016/0314575 | A1* | 10/2016 | Matsuo | G03F 7/7065 |
| 2017/0236303 | A1* | 8/2017 | Sano | G06K 9/4642 348/87 |
| 2017/0287750 | A1* | 10/2017 | Amano | H01L 21/67253 |
| 2019/0378739 | A1* | 12/2019 | Kiyotomi | H01L 21/67259 |
| 2020/0058121 | A1* | 2/2020 | Mori | H01L 21/67288 |
| 2020/0292470 | A1* | 9/2020 | Liao | G03F 7/30 |

FOREIGN PATENT DOCUMENTS

| | | |
|---|---|---|
| KR | 10-2017-0048784 A | 5/2017 |
| KR | 10-2017-0068419 A | 6/2017 |
| KR | 10-2017-0113099 A | 10/2017 |
| KR | 102000024 B1 | 7/2019 |

OTHER PUBLICATIONS

Korean Office Action dated Apr. 14, 2020 issued in corresponding Korean Appln. No. 10-2018-0145925.

* cited by examiner

SUBSTRATE TREATING APPARATUS AND APPARATUS AND METHOD FOR ECCENTRICITY INSPECTION

CROSS-REFERENCE TO RELATED APPLICATIONS

A claim for priority under 35 U.S.C. § 119 is made to Korean Patent Application No. 10-2018-0145925 filed on Nov. 23, 2018, in the Korean Intellectual Property Office, the entire contents of which are hereby incorporated by reference.

BACKGROUND

Embodiments of the inventive concept described herein relate to a substrate treating apparatus and an apparatus and method for eccentricity inspection, and more particularly, relate to a substrate treating apparatus and an eccentricity inspection apparatus and method for inspecting eccentricity of a support shaft of a spin chuck supporting a substrate, based on image processing.

Semiconductor elements are manufactured through various processes such as deposition, etching, cleaning, drying, and the like. For example, a cleaning process is performed to remove various types of contaminants adhering to the surface of a substrate because the contaminants such as particles, organic contaminants, metal contaminants, and the like that remain on the surface of the substrate greatly affect characteristics and manufacturing yield of semiconductor elements. A spin chuck is used to support and rotate a substrate in various processes including a cleaning process. The spin chuck is an apparatus for rotating the substrate at high speed to perform a process and is a very important component in a cleaning facility. In the case where bearings of the spin chuck are damaged or the force to grip chuck pins is weakened, the substrate may be eccentrically located when the spin chuck rotates. Due to this, a processing liquid may be scattered to contaminate a chamber, the substrate may be damaged, or a process accident may be caused. Furthermore, a processing liquid scattered to the surroundings due to the eccentric rotation of the spin chuck may be attached to the substrate again to degrade the quality of semiconductor elements and lower manufacturing yield.

A semiconductor manufacturing facility in the related art has no means for measuring eccentricity of a spin chuck. In the related art, a worker manually checks whether the spin chuck is in good condition or not and replaces the spin chuck, in consideration of the maintenance time, the time during which the semiconductor manufacturing facility is driven, or the number of times that the semiconductor manufacturing facility is driven. However, there is a difference in the replacement cycle of the spin chuck depending on operating environments of the semiconductor manufacturing facility. Therefore, the spin chuck fails to be checked or replaced at appropriate time. That is, in a poor process environment, eccentric rotation of the spin chuck occurs during a process due to an early failure of the spin chuck, and a process accident is more likely to take place. Furthermore, in a good process environment, the spin chuck is early replaced, causing loss, and due to the frequent replacement, a process has to be frequently stopped, resulting in deterioration in semiconductor productivity.

SUMMARY

Embodiments of the inventive concept provide a substrate treating apparatus, an eccentricity inspection apparatus and method, and a recording medium for accurately measuring the amount of eccentricity of a spin chuck, which supports and rotates a substrate, based on image processing.

Embodiments of the inventive concept provide a substrate treating apparatus, an eccentricity inspection apparatus and method, and a recording medium for preventing the amount of eccentricity of a spin chuck from being inaccurately measured due to a notch of a substrate and a chuck pin for supporting the substrate.

Embodiments of the inventive concept provide a substrate treating apparatus for providing lighting for accurately measuring the amount of eccentricity of a spin chuck.

According to an exemplary embodiment, a substrate treating apparatus includes a process chamber having a process space inside, a support unit that supports a substrate in the process space and rotates the substrate about a support shaft of a spin chuck, and an eccentricity inspection device that inspects eccentricity of the support shaft.

The eccentricity inspection device includes an image acquisition unit that obtains an image of the substrate supported on the support unit and an eccentricity measurement unit that obtains edge data of the substrate from the image of the substrate and measures an amount of eccentricity of the support shaft, based on the edge data.

The eccentricity measurement unit may include an equation modeling unit that receives a first image obtained for the substrate in a state in which the support shaft is not eccentrically located, obtains first edge data of the substrate from the first image, and models an estimation equation for measuring the amount of eccentricity of the support shaft, based on the first edge data, in which the substrate is supported on the support unit, and an eccentricity calculation unit that receives a second image obtained for the substrate during a process, obtains second edge data of the substrate from the second image, and measures the amount of eccentricity of the support shaft by comparing the second edge data with the estimation equation, in which the substrate is supported on the support unit.

The eccentricity measurement unit may further include an eccentricity determination unit that determines the eccentricity by comparing the amount of eccentricity of the support shaft with a set reference value and a warning generation unit that generates a warning when the eccentricity occurs.

The equation modeling unit may include a region of interest (ROI) setting unit that sets a region of interest (ROI) including an edge portion of the substrate in the first image, a first edge detection unit that detects an edge of the substrate in the region of interest (ROI) of the first image to obtain the first edge data, and an equation estimation unit that calculates the estimation equation, based on at least three pieces of point data included in the first edge data.

The region of interest (ROI) may include an upper left edge region or an upper right edge region of the substrate in the first image.

The equation estimation unit may include a point data acquisition unit that obtains three pieces of point data from the first edge data, a quadratic equation estimation unit that estimates a quadratic equation, based on the three pieces of point data, an equation verification unit that verifies the quadratic equation by calculating an error between the quadratic equation and the first edge data, and an estimation equation determination unit that determines a quadratic equation having a minimum error, among quadratic equations obtained by varying the three pieces of point data, to be the estimation equation.

The eccentricity calculation unit may include a second edge detection unit that detects an edge of the substrate in a region of interest (ROI) of the second image, an edge data acquisition unit that obtains the second edge data from the edge of the substrate that is detected in the region of interest (ROI) of the second image, and an eccentricity amount calculation unit that calculates the amount of eccentricity of the support shaft, based on a difference between the second edge data and the estimation equation.

The substrate treating apparatus may further include a lighting unit that supplies light to the substrate supported on the support unit. The lighting unit may include a plurality of lens-type lamps that supply the light toward different edge regions of the substrate in different directions. Adjacent regions, among the edge regions of the substrate that are illuminated by the lens-type lamps, may have an overlapping area therebetween.

The lighting unit may further include a frame and a plurality of brackets mounted on the frame so as to be directed toward the different edge regions of the substrate. The lens-type lamps may be coupled to upper surfaces of the brackets, and irradiation directions of the lens-type lamps may be adjusted depending on angles of the upper surfaces of the brackets.

According to an exemplary embodiment, an eccentricity inspection apparatus includes an image acquisition unit that obtains an image of a substrate supported to be rotatable about a support shaft of a spin chuck of a support unit in a process space of a process chamber and an eccentricity measurement unit that obtains edge data of the substrate from the image of the substrate and measures an amount of eccentricity of the support shaft, based on the edge data.

According to an exemplary embodiment, an eccentricity inspection method includes receiving an image of a substrate supported to be rotatable about a support shaft of a spin chuck of a support unit in a process space of a process chamber, obtaining edge data of the substrate from the image, and measuring an amount of eccentricity of the support shaft, based on the edge data.

The measuring of the amount of eccentricity may include determining eccentricity by comparing the amount of eccentricity of the support shaft with a set reference value and generating a warning when the eccentricity occurs.

The measuring of the amount of eccentricity may include receiving a first image obtained for the substrate in a state in which the support shaft is not eccentrically located, obtaining first edge data of the substrate from the first image, and modeling an estimation equation for measuring the amount of eccentricity of the support shaft, based on the first edge data, in which the substrate is supported on the support unit, and receiving a second image obtained for the substrate during a process, obtaining second edge data of the substrate from the second image, and calculating the amount of eccentricity of the support shaft by comparing the second edge data with the estimation equation, in which the substrate is supported on the support unit.

The modeling of the estimation equation may include setting a region of interest (ROI) including an edge portion of the substrate in the first image, obtaining the first edge data by detecting an edge of the substrate in the region of interest (ROI) of the first image, and calculating the estimation equation, based on at least three pieces of point data included in the first edge data.

The calculating of the estimation equation may include obtaining three pieces of point data from the first edge data and estimating a quadratic equation, based on the three pieces of point data, verifying the quadratic equation by calculating an error between the quadratic equation and the first edge data, and determining a quadratic equation having a minimum error, among quadratic equations obtained by varying the three pieces of point data, to be the estimation equation.

In determining the quadratic equation having the minimum error to be the estimation equation, the estimation equation may be calculated based on three pieces of point data not included in regions that are related to a notch of the substrate and a chuck pin that supports the substrate, respectively, in the region of interest (ROI) of the first image.

The calculating of the amount of eccentricity of the support shaft may include detecting an edge of the substrate in a region of interest (ROI) of the second image, obtaining the second edge data from the edge of the substrate that is detected in the region of interest (ROI) of the second image, and calculating the amount of eccentricity of the support shaft, based on a difference between the second edge data and the estimation equation.

According to an exemplary embodiment, a computer-readable recording medium has a program recorded therein for executing the eccentricity inspection method.

BRIEF DESCRIPTION OF THE FIGURES

The above and other objects and features will become apparent from the following description with reference to the following figures, wherein like reference numerals refer to like parts throughout the various figures unless otherwise specified, and wherein.

DETAILED DESCRIPTION

Figure 1:
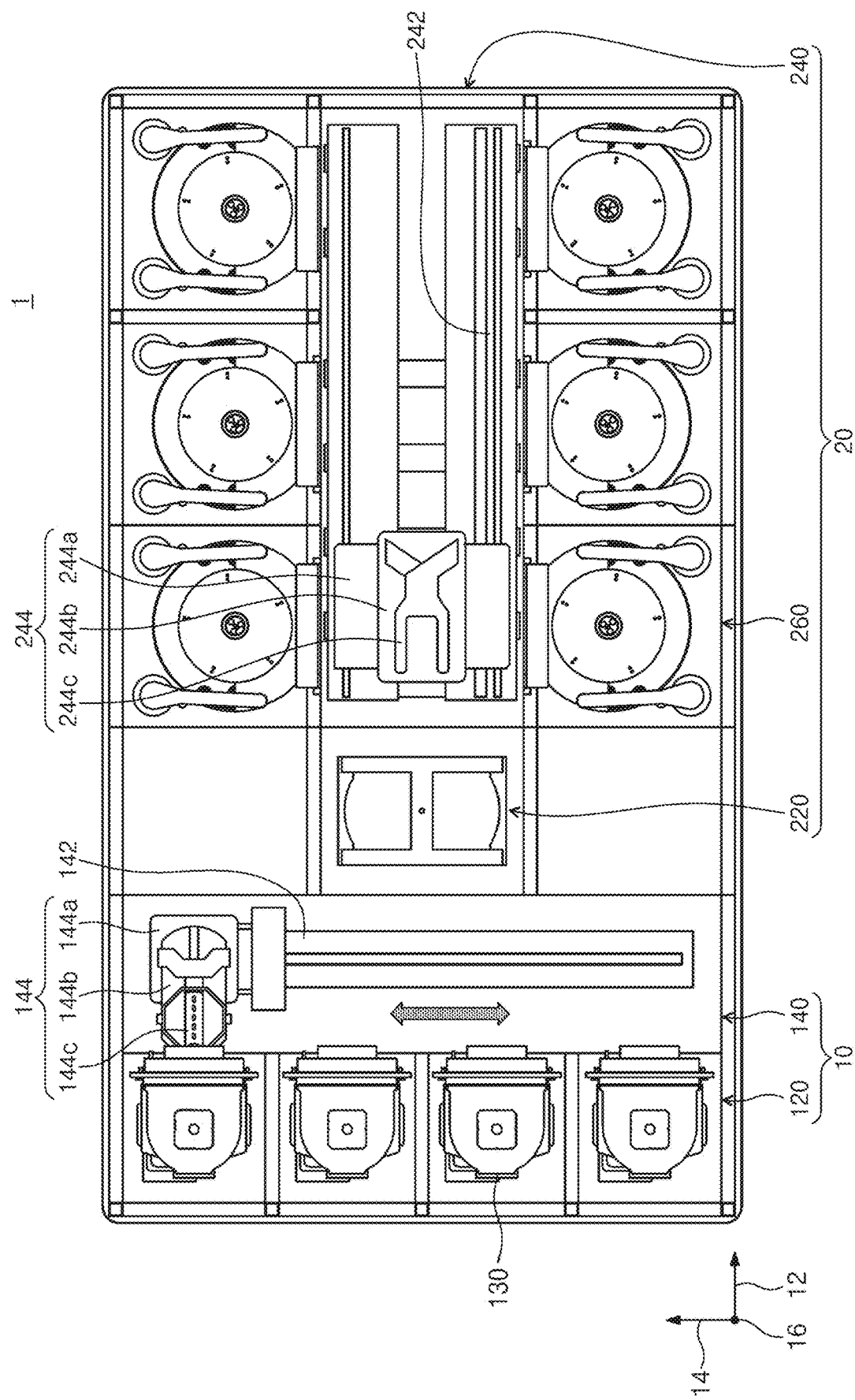
FIG. 1 is a plan view illustrating a substrate treating apparatus.

Hereinafter, embodiments of the inventive concept will be described in more detail with reference to the accompanying drawings. The inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. In the drawings, the dimensions of components are exaggerated for clarity of illustration.

A substrate treating apparatus according an embodiment of the inventive concept includes an eccentricity inspection apparatus for inspecting eccentricity of a spin chuck that supports and rotates a substrate. The eccentricity inspection apparatus may include an eccentricity inspection device for inspecting the eccentricity of the spin chuck, based on image processing. The eccentricity inspection device includes an image acquisition unit for obtaining an image of the substrate supported on the spin chuck of a support unit and an eccentricity measurement unit for obtaining edge data of the substrate from the image of the substrate and measuring the amount of eccentricity of the spin chuck based on the edge data.

In an embodiment, the eccentricity measurement unit may model an estimation equation that is the basis of measurement of the amount of eccentricity of the spin chuck. The estimation equation may be provided as a quadratic equation. The eccentricity measurement unit may obtain first edge data by detecting the edge of the substrate in a region of interest (ROI) of a first image obtained for the substrate supported on the spin chuck that is not eccentrically located, and may calculate the estimation equation based on the first image data.

The eccentricity measurement unit may obtain second edge data of the substrate in a region of interest (ROI) of a second image obtained for the substrate supported on the spin chuck during a process and may measure the amount of eccentricity of the spin chuck by comparing the second edge data with the estimation equation. The eccentricity measurement unit may determine eccentricity by comparing the amount of eccentricity of the spin chuck with a reference value and may generate a warning when the eccentricity occurs.

Hereinafter, a substrate treating apparatus, an eccentricity inspection apparatus, and an eccentricity inspection method according to embodiments of the inventive concept will be described, with a cleaning apparatus as an example. Prior to the description, it should be noted that the substrate treating apparatus, the eccentricity inspection apparatus, and the eccentricity inspection method according to the embodiments of the inventive concept are applicable to various substrate treating facilities that include a spin chuck for supporting and rotating a substrate, as well as the cleaning apparatus.

FIG. 1 is a plan view illustrating the substrate treating apparatus. Referring to FIG. 1, the substrate treating apparatus 1 includes an index module 10 and a process module 20. The index module 10 includes load ports 120 and a transfer frame 140. The load ports 120, the transfer frame 140, and the process module 20 may be sequentially arranged. Hereinafter, the direction in which the load ports 120, the transfer frame 140, and the process module 20 are arranged is referred to as a first direction 12, a direction perpendicular to the first direction 12 on the plane is referred to as a second direction 14, and a direction perpendicular to the plane including the first direction 12 and the second direction 14 is referred to as a third direction 16.

Carriers 130, each of which has substrates received therein, are placed on the load ports 120. The load ports 120 are arranged in a row along the second direction 14. FIG. 1 illustrates an example that the index module 10 includes four load ports 120. However, the number of load ports 120 may be increased or decreased depending on conditions such as the process efficiency and the footprint of the process module 20.

Each of the carriers 130 has a plurality of slots (not illustrated) that are formed therein to support the edges of the substrates. The plurality of slots are arranged in the third direction 16. The substrates are stacked in the carrier 1300 in the state of being spaced apart from each other along the third direction 16. A front opening unified pod (FOUP) may be used as the carrier 130.

The process module 20 includes a buffer unit 220, a transfer chamber 240, and process chambers 260. The transfer chamber 240 is arranged such that the lengthwise direction thereof is parallel to the first direction 12. The process chambers 260 are disposed on one side and an opposite side of the transfer chamber 240 along the second direction 14. The process chambers 260 are arranged along the lengthwise direction of the transfer chamber 240.

The buffer unit 220 is disposed between the transfer frame 140 and the transfer chamber 240. The buffer unit 220 provides a space in which substrates stay before transferred between the transfer chamber 240 and the transfer frame 140. The buffer unit 220 has a plurality of slots therein, on which the substrate are placed. The slots are spaced apart from each other along the third direction 16. The buffer unit 220 is open at one side facing the transfer frame 140 and at an opposite side facing the transfer chamber 240.

The transfer frame 140 transfers substrates between the carriers 130 placed on the load ports 120 and the buffer unit 220. An index rail 142 and an index robot 144 are provided in the transfer frame 140. The index rail 142 is arranged such that the lengthwise direction thereof is parallel to the second direction 14. The index robot 144 is installed on the index rail 142 and rectilinearly moves in the second direction 14 along the index rail 142.

The index robot 144 has a base 144a, a body 144b, and index arms 144c. The base 144a is installed so as to be movable along the index rail 142. The body 144b is coupled to the base 144a. The body 144b is movable on the base 144a along the third direction 16. Furthermore, the body 144b is rotatable on the base 144a.

The index arms 144c are coupled to the body 144b and are movable forward and backward relative to the body 144b. The index arms 144c individually operate. The index arms 144c are stacked one above another with a spacing gap therebetween along the third direction 16. Some of the index arms 144c may be used to transfer substrates from the process module 20 to the carriers 130, and the other index arms 144c may be used to transfer substrates from the carriers 130 to the process module 20. Accordingly, particles generated from substrates to be treated may be prevented from adhering to treated substrates in the process in which the index robot 144 transfers the substrates between the carriers 130 and the process module 20.

The transfer chamber 240 transfers substrates between the buffer unit 220 and the process chambers 260 and between the process chambers 260. A guide rail 242 and a main robot 244 are provided in the transfer chamber 240. The guide rail 242 is arranged such that the lengthwise direction thereof is parallel to the first direction 12. The main robot 244 is installed on the guide rail 242 and rectilinearly moves on the guide rail 242 along the first direction 12.

The main robot 244 has a base 244a, a body 244b, and main arms 244c. The base 244a is installed so as to be movable along the guide rail 242. The body 244b is coupled to the base 244a. The body 244b is movable on the base 244a along the third direction 16. Furthermore, the body 244b is rotatable on the base 244a.

The main arms 244c are coupled to the body 244b and are movable forward and backward relative to the body 244b. The main arms 244c individually operate. The main arms 244c are stacked one above another with a spacing gap therebetween along the third direction 16. The main arms 244c used to transfer substrates from the buffer unit 220 to the process chambers 260 may differ from the main arms 244c used to transfer substrates from the process chambers 260 to the buffer unit 220.

Figure 2:
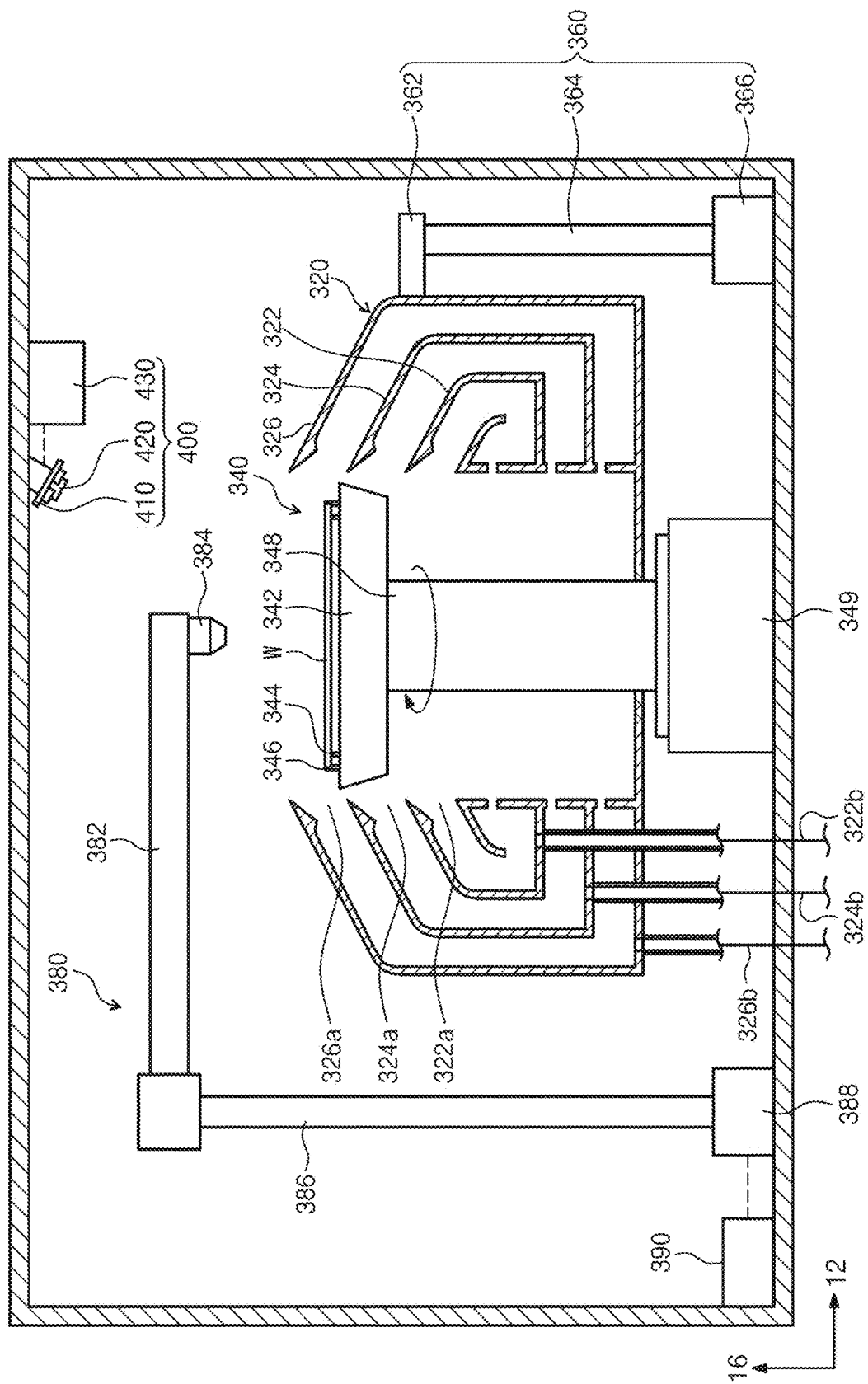
FIG. 2 is a sectional view illustrating an example of process modules provided in one or more of process chambers.

Each of the process chambers 260 includes a process module for treating a substrate with a processing liquid. The process modules in the respective process chambers 260 may have the same structure or different structures. FIG. 2 is a sectional view illustrating an example of the process modules provided in one or more of the process chambers. Referring to FIG. 2, the process module 300 includes a cup 320, a support unit 340, a lifting unit 360, a dispensing member 380, a controller 390, and an eccentricity inspection device 400.

The cup 320 provides a space in which a substrate treating process is performed. The cup 320 is open at the top thereof. The cup 320 has an inner recovery bowl 322, an intermediate recovery bowl 324, and an outer recovery bowl 326. The recovery bowls 322, 324, and 326 recover different processing liquids used in the substrate treating process. The inner recovery bowl 322 has an annular ring shape surrounding the support unit 340, the intermediate recovery bowl 324 has an annular ring shape surrounding the inner recovery bowl 322, and the outer recovery bowl 326 has an annular ring shape surrounding the intermediate recovery bowl 324.

An interior space 322a of the inner recovery bowl 322, a space 324a between the inner recovery bowl 322 and the intermediate recovery bowl 324, and a space 326a between the intermediate recovery bowl 324 and the outer recovery bowl 326 function as inlets through which the processing liquids are introduced into the inner recovery bowl 322, the intermediate recovery bowl 324, and the outer recovery bowl 326. The recovery bowls 322, 324, and 326 have recovery lines 322b, 324b, and 326b connected thereto, which vertically extend downward from bottom surfaces of the recovery bowls 322, 324, and 326. The recovery lines 322b, 324b, and 326b drain the processing liquids introduced through the recovery bowls 322, 324, and 326. The drained processing liquids may be reused through an external processing liquid regeneration system (not illustrated).

The support unit 340 is disposed in the cup 320. The support unit 340 may include a spin chuck that supports and rotates a substrate W during a process. The support unit 340 has a body 342, support pins 344, chuck pins 346, and a support shaft 348. The body 342 has an upper surface in a substantially circular shape when viewed from above. The support shaft 348 that is rotatable by a motor 349 is fixedly coupled to a bottom surface of the body 342.

The support pins 344 are arranged on an edge portion of the upper surface of the body 342 with a predetermined spacing gap therebetween and protrude upward from the body 342. The support pins 344 are arranged to form an annular ring shape as a whole by a combination thereof. The support pins 344 support the edge of the backside of the substrate W such that the substrate W is spaced apart from the upper surface of the body 342 by a predetermined distance.

The chuck pins 346 are disposed farther away from the center of the body 342 than the support pins 344. The chuck pins 346 protrude upward from the body 342. The chuck pins 346 support the side of the substrate W to prevent the substrate W from deviating from the correct position to a side when the support unit 340 rotates.

The chuck pins 346 are rectilinearly movable between a standby position and a support position along the radial direction of the spin head 342. The standby position is a position farther away from the center of the body 342 than the support position. The chuck pins 346 are located in the standby position when the substrate W is loaded onto or unloaded from the support unit 340, and the chuck pins 346 are located in the support position when a process is performed on the substrate W. In the support position, the chuck pins 346 are brought into contact with the side of the substrate W.

The lifting unit 360 rectilinearly moves the cup 320 in the vertical direction. As the cup 320 is moved in the vertical direction, the height of the cup 320 relative to the support unit 340 is varied. The lifting unit 360 has a bracket 362, a movable shaft 364, and an actuator 366. The bracket 362 is fixedly attached to the outer wall of the cup 320. The movable shaft 364 is fixedly coupled to the bracket 362 and is vertically moved by the actuator 366.

When the substrate W is placed on the support unit 340 or lifted upward from the support unit 340, the cup 320 is moved downward to cause the support unit 340 to protrude above the cup 320. Furthermore, when a process is performed, the height of the cup 320 is adjusted depending on the types of processing liquids, which are dispensed onto the substrate W, to cause the processing liquids to be introduced into the recovery bowls 322, 324, and 326.

For example, while the substrate W is treated with the first processing liquid, the substrate W is located at the height corresponding to the interior space 322a of the inner recovery bowl 322. Furthermore, while the substrate W is treated with the second processing liquid, the substrate W may be located at the height corresponding to the space 324a between the inner recovery bowl 322 and the intermediate recovery bowl 324, and while the substrate W is treated with the third processing liquid, the substrate W may be located at the height corresponding to the space 326a between the intermediate recovery bowl 324 and the outer recovery bowl 326. Unlike that described above, the lifting unit 360 may vertically move the support unit 340 instead of the cup 320.

The dispensing member 380 dispenses the processing liquids onto the substrate W during the substrate treating process. The processing liquids may include a cleaning solution such as deionized water for removing particles adhering to the substrate W, an organic solvent such as IPA, a rinsing solution, and the like. The dispensing member 380 has a nozzle support rod 382, a nozzle 384, a support shaft 386, and an actuator 388. The support shaft 386 is arranged such that the lengthwise direction thereof is parallel to the third direction 16, and the actuator 388 is coupled to a lower end of the support shaft 386. The actuator 388 rotates, raises, and lowers the support shaft 386.

The nozzle support rod 382 is coupled perpendicular to an upper end of the support shaft 386 that is opposite to the lower end of the support shaft 386 to which the actuator 388 is coupled. The nozzle 384 is mounted on a bottom surface of a distal end of the nozzle support rod 382. The nozzle 382 is moved between a process position and a standby position by the actuator 388. The process position is a position directly above the support unit 340 where the nozzle 382 dispenses the processing liquids onto the substrate W. The standby position is a position where the nozzle 384 is located outside the region directly above the support unit 340. One or more dispensing members 380 may be provided. In the case where the plurality of dispensing members 380 are provided, a chemical, a rinsing solution, and an organic solvent may be dispensed through the different dispensing members 380. The controller 390 controls the components of the process module 300.

The eccentricity inspection device 400 for inspecting the eccentricity of the support shaft 348 of the spin chuck includes a lighting unit 410, an image acquisition unit 420, and an eccentricity measurement unit 430. The lighting unit 410 may supply light appropriate for taking an image of the substrate W. The lighting unit 410 may be fixedly attached to the ceiling of the process chamber or an upper portion of the sidewall of the process chamber to supply light to the substrate W.

The image acquisition unit 420 takes an image of the substrate W supported on the spin chuck of the support unit 340. The image acquisition unit 420 may be implemented with, but is not limited to, a charge coupled device (CCD) camera, a complementary metal oxide semiconductor (CMOS) camera, or the like. The image acquisition unit 420 may be fixedly attached to the ceiling of the process chamber or an upper portion of the sidewall of the process chamber to take an image of the substrate W. The image acquisition unit 420 may be installed in a position laterally distant from the center of the substrate W by a predetermined distance so as to prevent the substrate W from being hidden by the nozzle 384 and may obliquely take an image of the top side of the substrate W.

Figure 3:
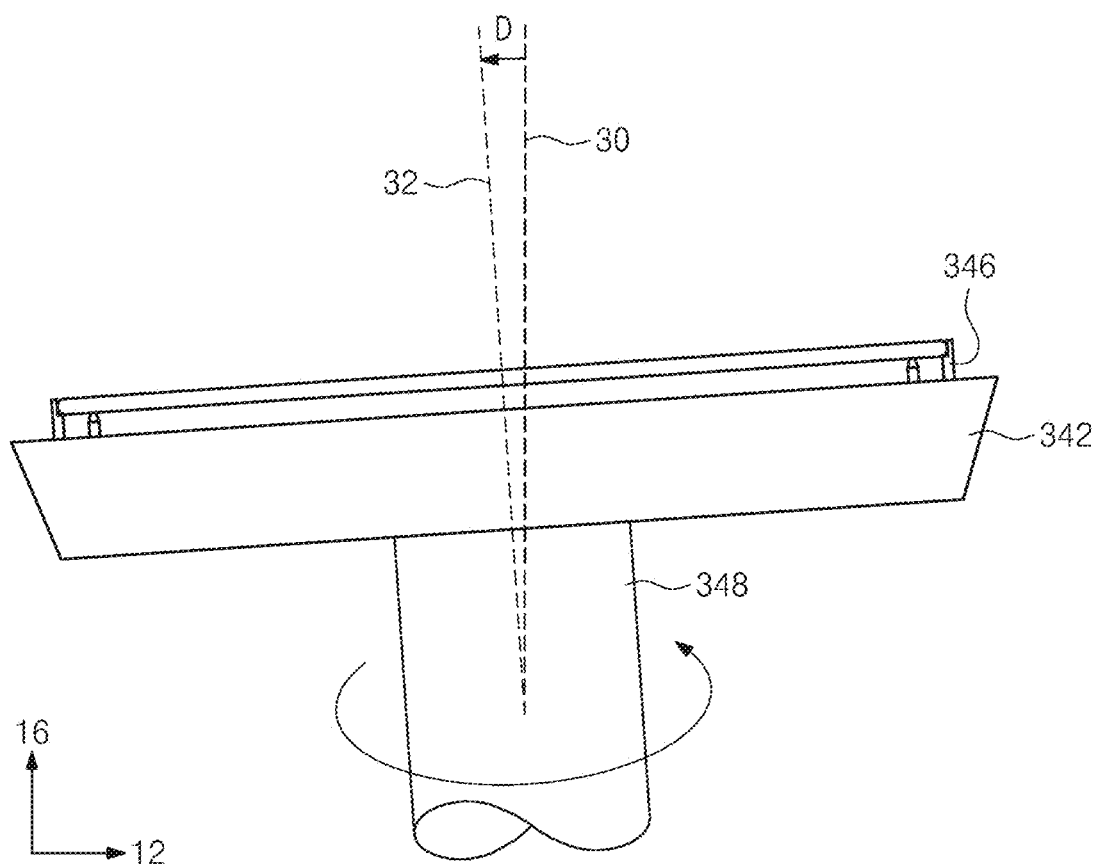
FIG. 3 is a view illustrating an eccentric state of a support shaft of a support unit constituting the substrate treating apparatus.

The eccentricity measurement unit 430 obtains edge data of the substrate W from the image of the substrate W and measures the amount of eccentricity of the support shaft 348, based on the edge data. FIG. 3 is a view illustrating an eccentric state of the support shaft of the support unit constituting the substrate treating apparatus. As the substrate treating apparatus is used for a long period of time and aging correspondingly, the support shaft 348 of the spin chuck of the support unit 340 may be eccentrically located from a reference direction 30 parallel to the third direction 16 to an eccentric direction 32. The eccentricity measurement unit 430 is configured to quantitatively accurately measure the amount of eccentricity D of the support shaft 348 of the spin chuck. The eccentricity measurement unit 430 may include at least one processor and a memory.

Figure 4:
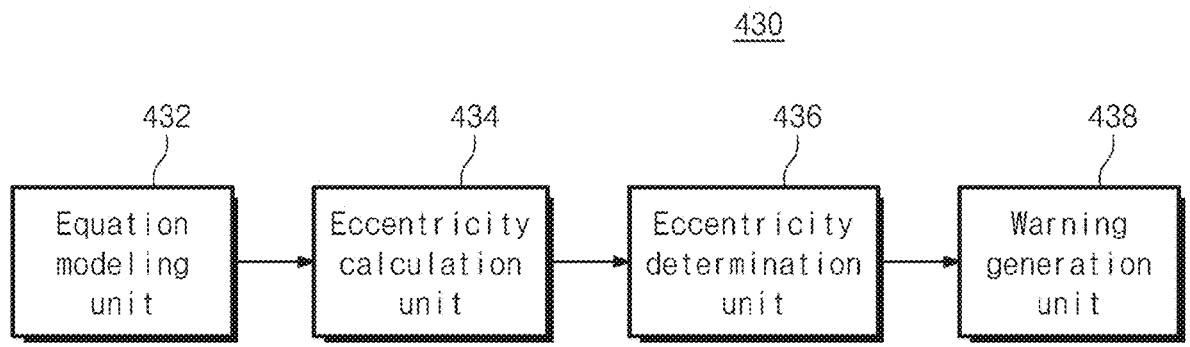
FIG. 4 is a view illustrating a configuration of an eccentricity measurement unit of an eccentricity inspection apparatus according to an embodiment of the inventive concept.
Figure 5:
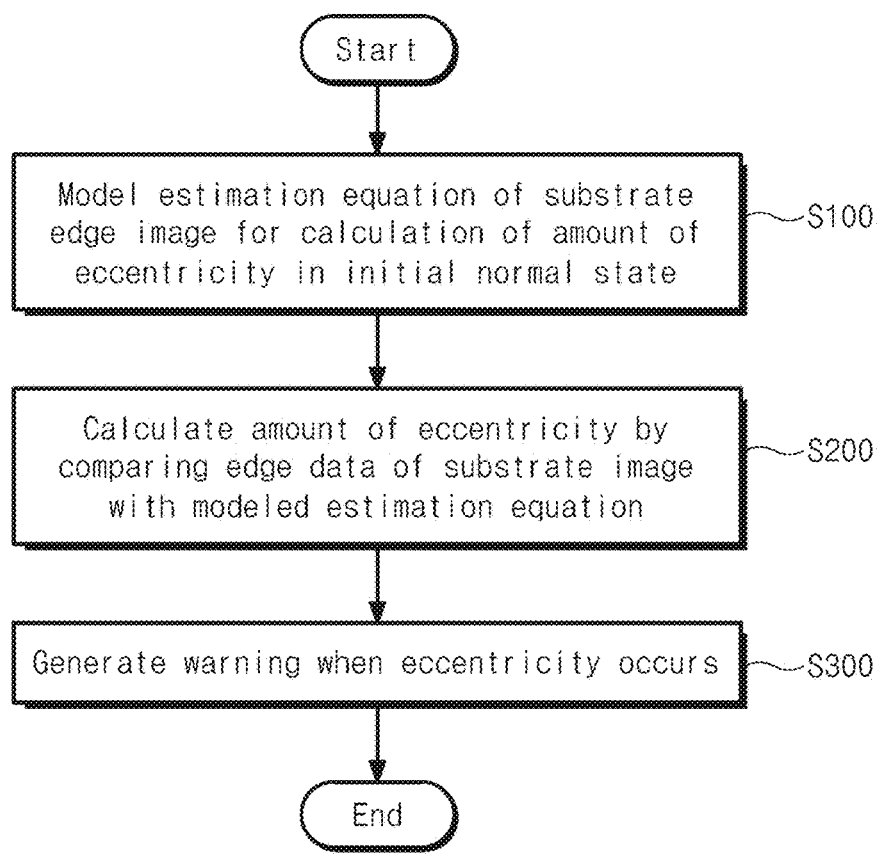
FIG. 5 is a flowchart illustrating an eccentricity inspection method according to an embodiment of the inventive concept.

FIG. 4 is a view illustrating a configuration of the eccentricity measurement unit of the eccentricity inspection apparatus according to an embodiment of the inventive concept. FIG. 5 is a flowchart illustrating an eccentricity inspection method according to an embodiment of the inventive concept. Referring to FIGS. 3 to 5, the eccentricity measurement unit 430 may include an equation modeling unit 432, an eccentricity calculation unit 434, an eccentricity determination unit 436, and a warning generation unit 438.

When the substrate W is loaded onto the spin chuck of the support unit 340, the equation modeling unit 432 receives, from the image acquisition unit 420, a first image obtained for the substrate W before the start of a process in a state (an initial normal state) in which the support shaft 348 of the spin chuck is not eccentrically located. The equation modeling unit 432 obtains first edge data of the substrate W from the first image taken in the state (the initial normal state) in which the support shaft 348 is not eccentrically located, and models an estimation equation for measuring the amount of eccentricity of the support shaft 348, based on the first edge data (S100).

Figure 6:
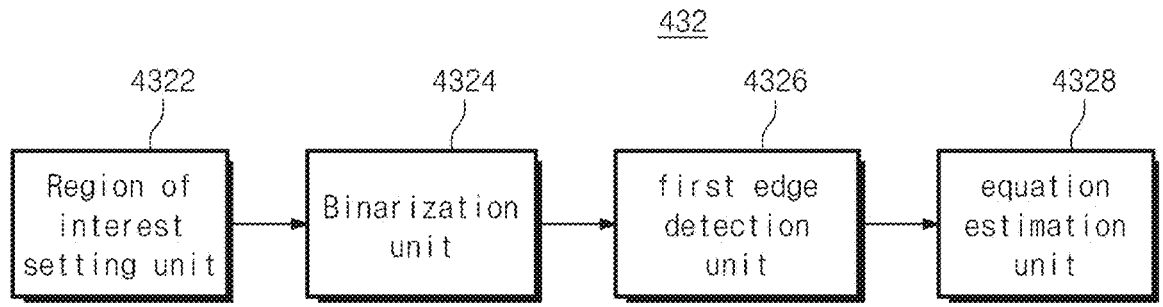
FIG. 6 is a view illustrating a configuration of an equation modeling unit of the eccentricity inspection apparatus according to an embodiment of the inventive concept.
Figure 7:
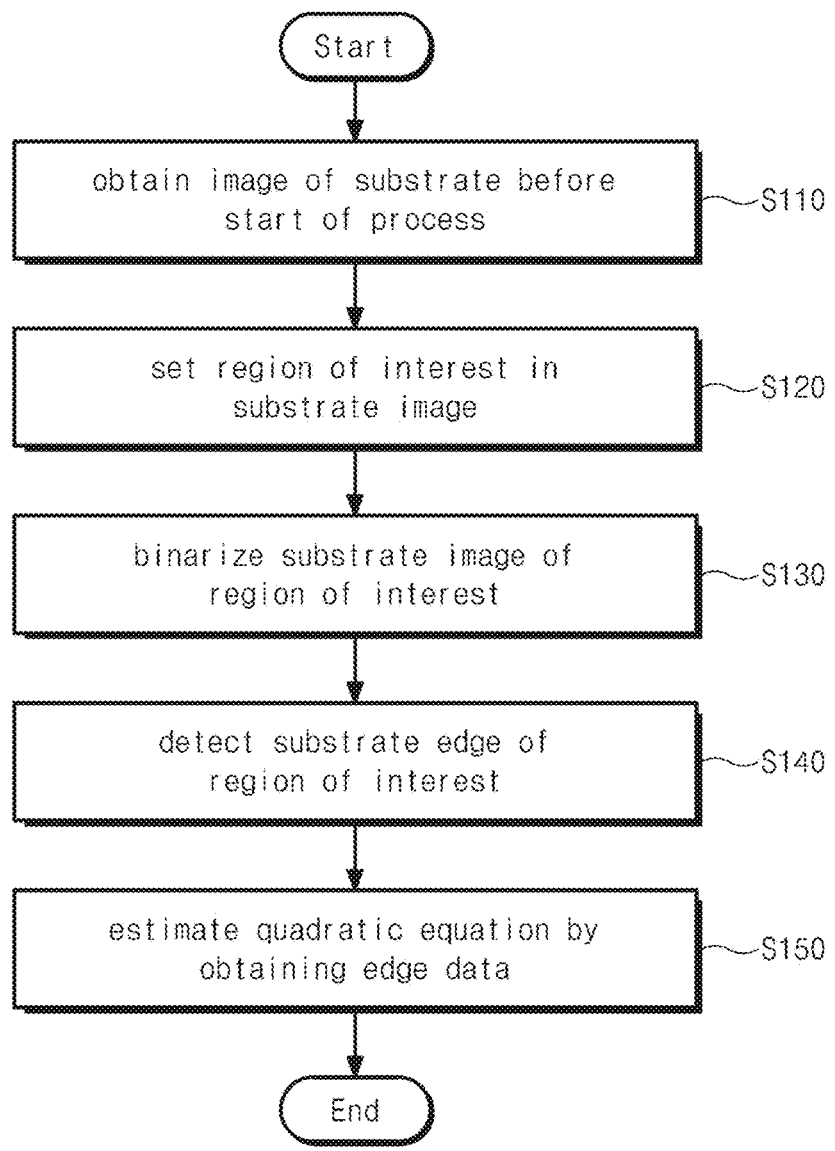
FIG. 7 is a flowchart specifically illustrating step S100 of FIG. 5.

FIG. 6 is a view illustrating a configuration of the equation modeling unit of the eccentricity inspection apparatus according to an embodiment of the inventive concept. FIG. 7 is a flowchart specifically illustrating step S100 of FIG. 5. Referring to FIGS. 3, 6, and 7, the equation modeling unit 432 may include a region of interest (ROI) setting unit 4322, a binarization unit 4324, a first edge detection unit 4326, and an equation estimation unit 4328.

Figure 8:
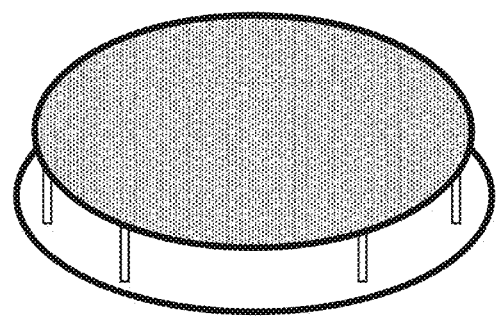
FIG. 8 is a view illustrating a first image obtained for a substrate in an initial normal state in which the spin chuck is not eccentrically located, where the substrate is supported on the spin chuck.
Figure 9:
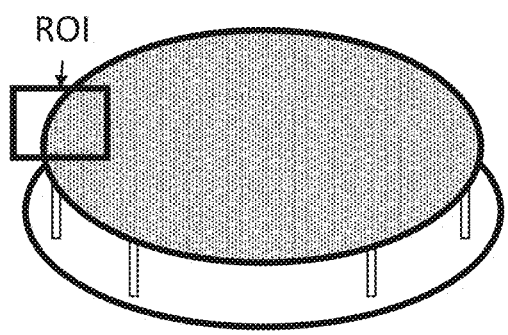
FIG. 9 is a view illustrating a region of interest (ROI) that is set in the first image illustrated in FIG. 8.

The ROI setting unit 4322 sets a region of interest (ROI) including the edge of the substrate W in the first image obtained in the initial normal state in which the spin chuck is not eccentrically located. FIG. 8 is a view illustrating the first image obtained for the substrate in the initial normal state in which the spin chuck is not eccentrically located, where the substrate is supported on the spin chuck. FIG. 9 is a view illustrating the ROI that is set in the first image illustrated in FIG. 8.

When the first image of the substrate W is obtained by the image acquisition unit 420 before the start of the process, the ROI setting unit 4322 sets the region of interest (ROI) including the edge of the substrate W in the first image so as to calculate the estimation equation that is the basis of inspection of the eccentricity of the spin chuck (S110 and S120).

The image acquisition unit 420 may be installed in a position laterally distant from the center of the substrate W so as to prevent the substrate W from being hidden by the nozzle 384 and may take an image of the substrate W. Therefore, in the first image, the edge of the substrate W appears to be distorted in a polynomial form rather than a circular form. As illustrated in FIG. 9, the ROI setting unit 4322 may set the upper left edge region or the upper right edge region of the substrate W, which is closest to a second-order polynomial form, as the region of interest (ROI) in the first image.

Figure 10:
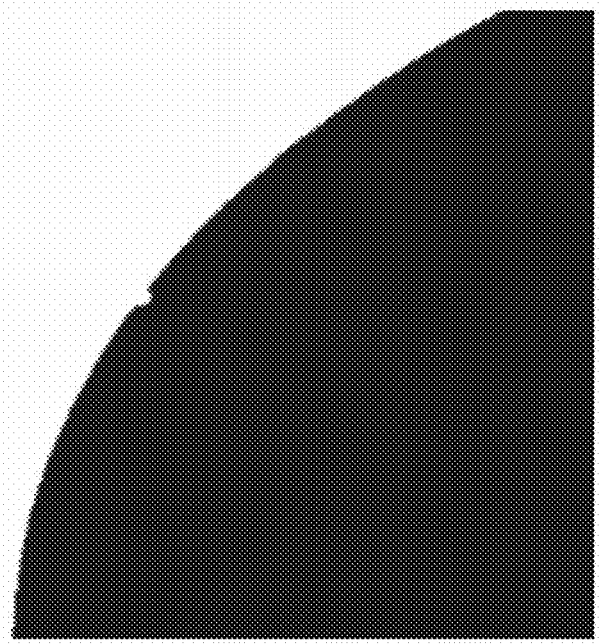
FIG. 10 is a view illustrating a binarized region of interest of the first image obtained in the state in which the spin chuck is not eccentrically located, according to an embodiment of the inventive concept.

When the region of interest (ROI) is set in the first image, the binarization unit 4324 binarizes the set region of interest (ROI) in the first image (S130). FIG. 10 is a view illustrating the binarized region of interest of the first image obtained in the state in which the spin chuck is not eccentrically located, according to an embodiment of the inventive concept. The region of the substrate W and the background region may be clearly distinguished from each other by the binarization.

Figure 11:
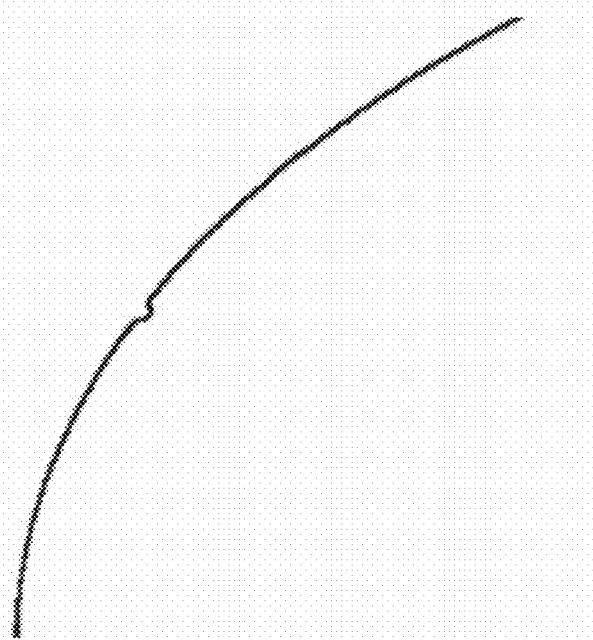
FIG. 11 is a view illustrating first edge data of the first image obtained in the state in which the spin chuck is not eccentrically located, according to an embodiment of the inventive concept.
Figure 12:
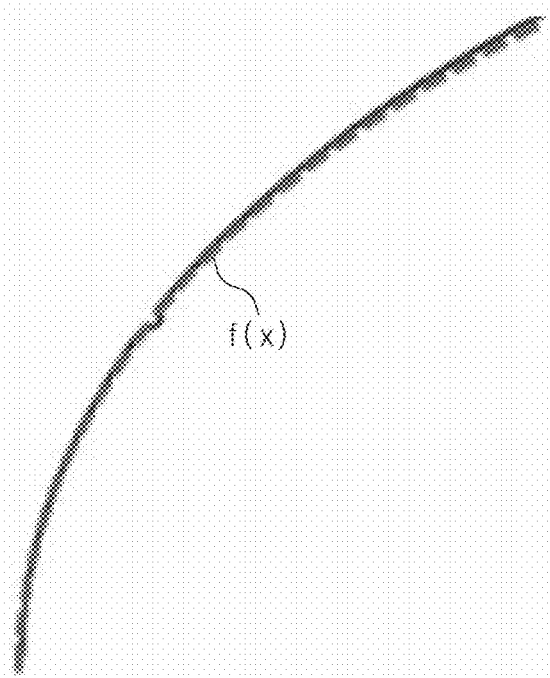
FIG. 12 is a view illustrating an estimation equation calculated according to an embodiment of the inventive concept.

When the region of interest of the first image is binarized, the first edge detection unit 4326 detects the binarized edge region of the substrate W and obtains the first edge data (S140). A specific description of an edge detection algorithm is not given so as to prevent subject matters of the inventive concept from being made obscure. FIG. 11 is a view illustrating the first edge data of the first image obtained in the state in which the spin chuck is not eccentrically located, according to an embodiment of the inventive concept. When the first edge data of the first image is obtained, the equation estimation unit 4328 may calculate the estimation equation having the form of a quadratic equation, based on at least three pieces of point data included in the first edge data (S150). FIG. 12 is a view illustrating the estimation equation f(x) calculated according to an embodiment of the inventive concept.

Figure 13:
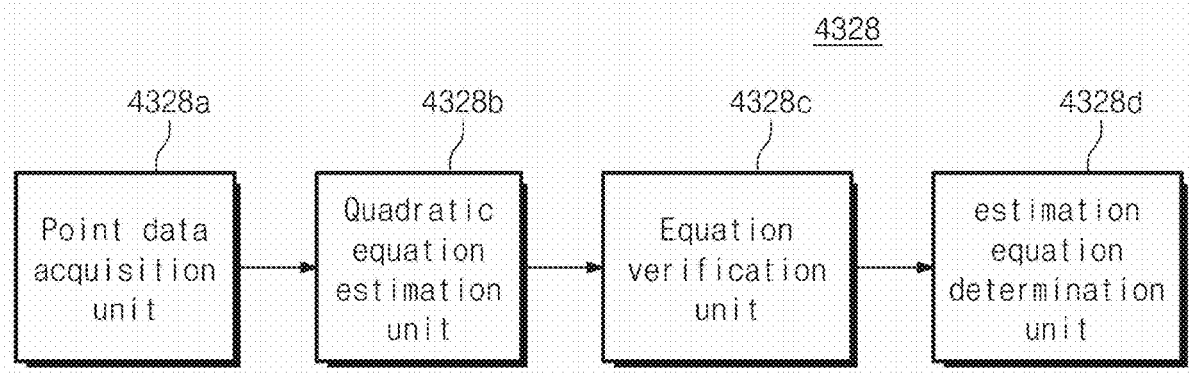
FIG. 13 is a view illustrating a configuration of an equation estimation unit of the eccentricity inspection apparatus according to an embodiment of the inventive concept.
Figure 14:
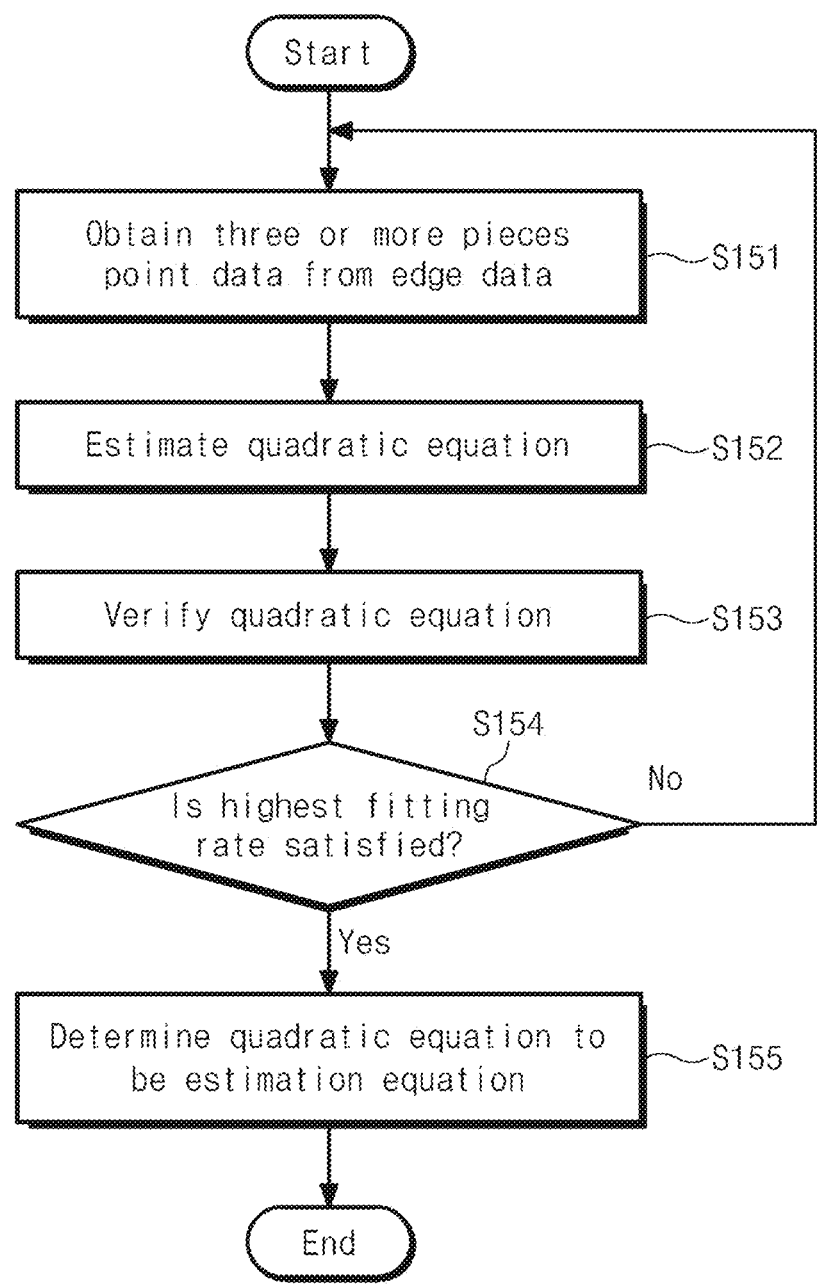
FIG. 14 is a flowchart specifically illustrating step S150 illustrated in FIG. 12.

FIG. 13 is a view illustrating a configuration of the equation estimation unit of the eccentricity inspection apparatus according to an embodiment of the inventive concept. FIG. 14 is a flowchart specifically illustrating step S150 illustrated in FIG. 12. Referring to FIGS. 13 and 14, the equation estimation unit 4328 may include a point data acquisition unit 4328*a*, a quadratic equation estimation unit 4328*b*, an equation verification unit 4328*c*, and an estimation equation determination unit 4328*b*.

Figure 15:
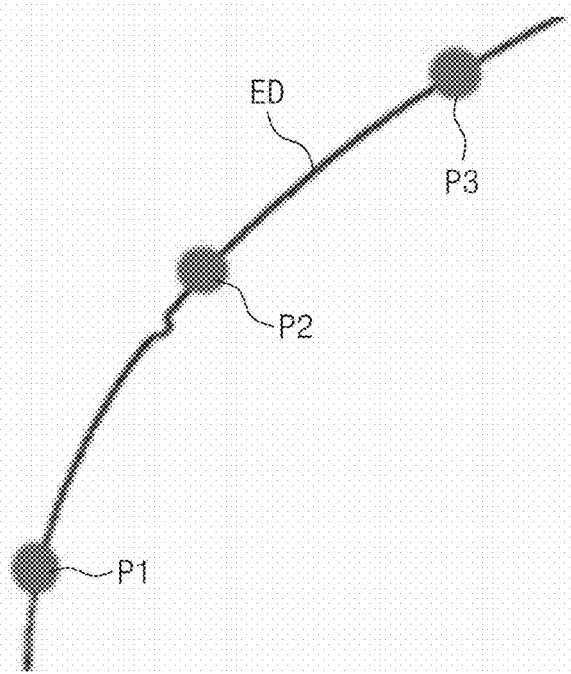
FIG. 15 is a view illustrating three pieces of point data randomly selected from the first edge data obtained in the state in which the spin chuck is not eccentrically located, according to an embodiment of the inventive concept.

The point data acquisition unit 4328*a* randomly obtains three pieces of point data from the first edge data, including N pieces of point data (N being an integer of 4 or more), which is obtained from the first image taken in the state in which the spin chuck is not eccentrically located (S151). FIG. 15 is a view illustrating three pieces of point data randomly selected from the first edge data obtained in the state in which the spin chuck is not eccentrically located, according to an embodiment of the inventive concept.

When the three pieces of point data P1, P2, and P3 are obtained from the first edge data ED, the quadratic equation estimation unit 4328*b* estimates a quadratic equation, based on the randomly obtained three pieces of point data P1, P2, and P3 (S152). Taking the coordinates of the three pieces of point data P1, P2, and P3 to be $(x_1, y_1)$, $(x_2, y_2)$, and $(x_3, y_3)$, the relationship of Equation 1 below is established.

$$\begin{bmatrix} x_1^2 & x_1 & 1 \\ x_2^2 & x_2 & 1 \\ x_3^2 & x_3 & 1 \end{bmatrix} \begin{bmatrix} a \\ b \\ c \end{bmatrix} = \begin{bmatrix} y_1 \\ y_2 \\ y_3 \end{bmatrix}$$ [Equation 1]

$$A = \begin{bmatrix} x_1^2 & x_1 & 1 \\ x_2^2 & x_2 & 1 \\ x_3^2 & x_3 & 1 \end{bmatrix}$$

$$X = \begin{bmatrix} a \\ b \\ c \end{bmatrix}$$

$$B = \begin{bmatrix} y_1 \\ y_2 \\ y_3 \end{bmatrix}$$

Because the relationship AX=B is established in Equation 1, the quadratic equation estimation unit 4328*b* may calculate X as 2pseudo-inverse and may calculate polynomial coefficients of the quadratic equation by the operation $X=(A^TA)^{-1}A^TB$ (a being the coefficient of the second order term, b being the coefficient of the first order term, and c being a constant).

The equation verification unit 4328*c* verifies the quadratic equation by calculating the error between the quadratic equation, which is estimated by the quadratic equation estimation unit 4328*b*, and the first edge data (S153). This process is performed for evaluating how many pieces of point data of the first edge data are included in the estimated quadratic equation. The error between the quadratic equation and the first edge data may be calculated based on the differences between the N pieces of point data of the first edge data and the N function values of the quadratic equation that correspond to the N pieces of point data.

Because the quadratic equation is a polynomial estimated based on the three pieces of point data randomly selected from the N pieces of point data, the quadratic equation may have a large error with the (N−3) pieces of point data other than the three pieces of point data when at least one of the three pieces of point data is selected at a notch of the substrate W. To determine a quadratic equation accurately reflecting the edge position and shape of the substrate W to be the estimation equation, the estimation equation determination unit 4328*d* may determine a quadratic equation with the highest fitting rate and a minimum error, among quadratic equations obtained by randomly varying three pieces of point data, to be the estimation equation (S154 and S155). The number of selectable combinations of the three pieces of point data is up to $_NC_3 = N!/\{(N-3)! \times 3!\}$.

The estimation equation determination unit 4328*d* may calculate quadratic equations for all combinations of three pieces of point data of the first edge data and may determine a quadratic equation having a minimum error, among the quadratic equations, to be the estimation equation. Alternatively, in the case where a quadratic equation having an error of a set comparison value or less, among quadratic equations calculated for combinations of point data, is derived, the estimation equation determination unit 4328*d* may determine the corresponding quadratic equation to be the estimation equation. In another case, the estimation equation determination unit 4328*d* may estimate quadratic equations for combinations of a preset number of pieces of point data and may determine a quadratic equation having a minimum error, among the quadratic equations, to be the estimation equation.

Figure 16:
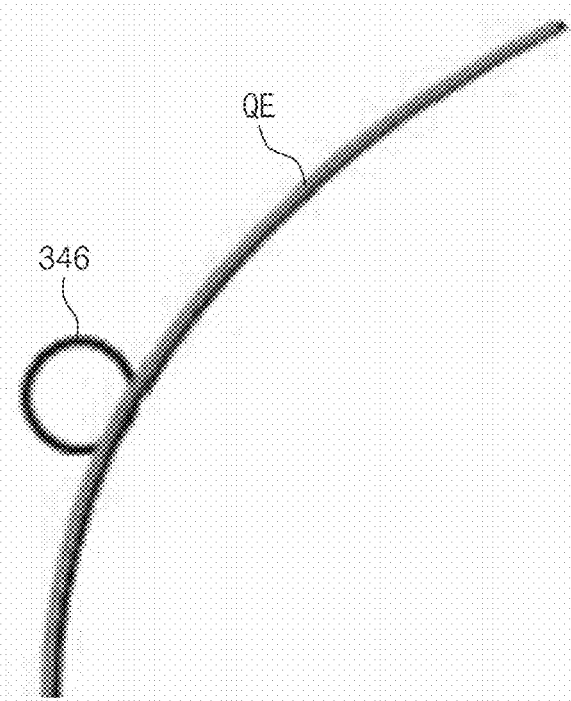
FIGS. 16 and 17 are views illustrating the estimation equation calculated according to an embodiment of the inventive concept.
Figure 17:
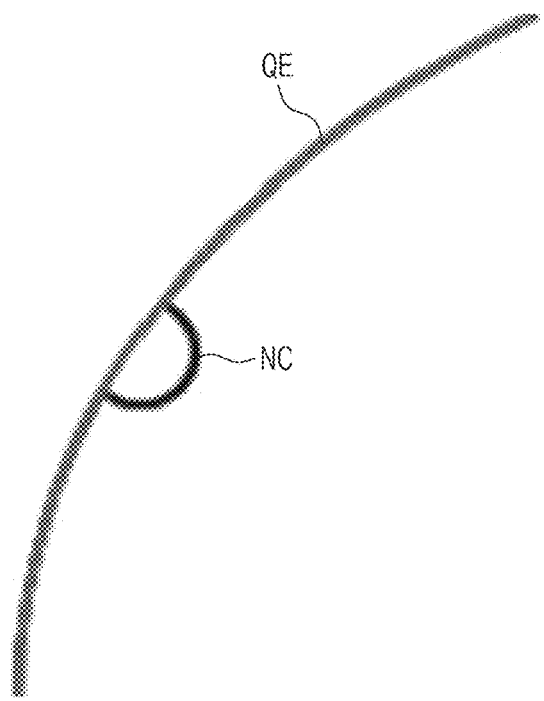

FIGS. 16 and 17 are views illustrating the estimation equation calculated according to an embodiment of the inventive concept. As illustrated in blue in FIGS. 16 and 17, an estimation equation QE accurately reflecting the edge position and shape of the substrate W may be obtained by repeatedly performing the quadratic-equation verification process until an estimation equation including the largest number of pieces of first edge data is found.

According to an embodiment of the inventive concept, as illustrated in FIGS. 16 and 17, the estimation equation QE may be calculated based on three pieces of point data not included in regions that are related to a notch NC of the substrate W and the chuck pin 346 in the region of interest (ROI) of the first image. Accordingly, the amount of eccentricity of the spin chuck may be accurately calculated by calculating the estimation equation QE that accurately approximates to the edge of the substrate W.

Referring again to FIGS. 4 and 5, when the estimation equation is modeled by the equation modeling unit 432, the eccentricity calculation unit 434 calculates the amount of eccentricity of the support shaft 348 of the spin chuck by comparing edge data of an image obtained for the substrate W during the process with the estimation equation (S200). The eccentricity determination unit 436 determines eccentricity by comparing the amount of eccentricity of the support shaft 348 of the spin chuck with a set reference value, and the warning generation unit 438 generates a warning when the eccentricity occurs (S300).

Figure 18:
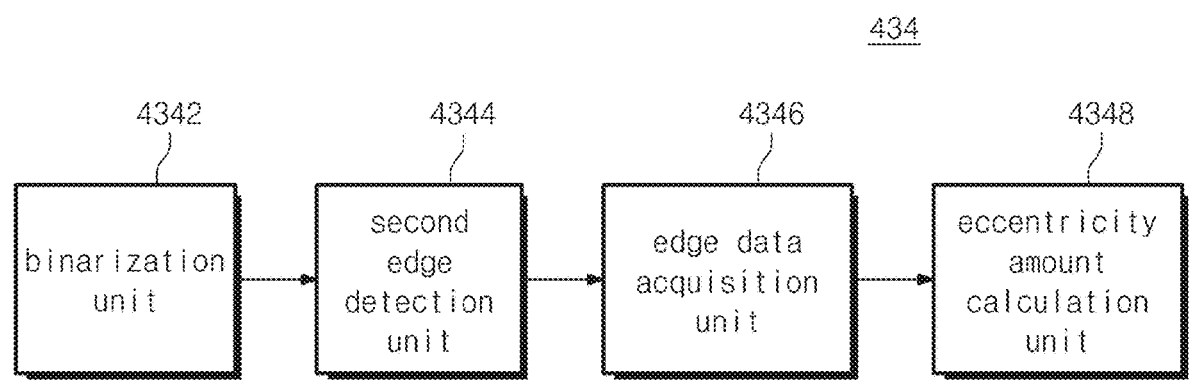
FIG. 18 is a view illustrating a configuration of an eccentricity calculation unit of the eccentricity inspection apparatus according to an embodiment of the inventive concept.
Figure 19:
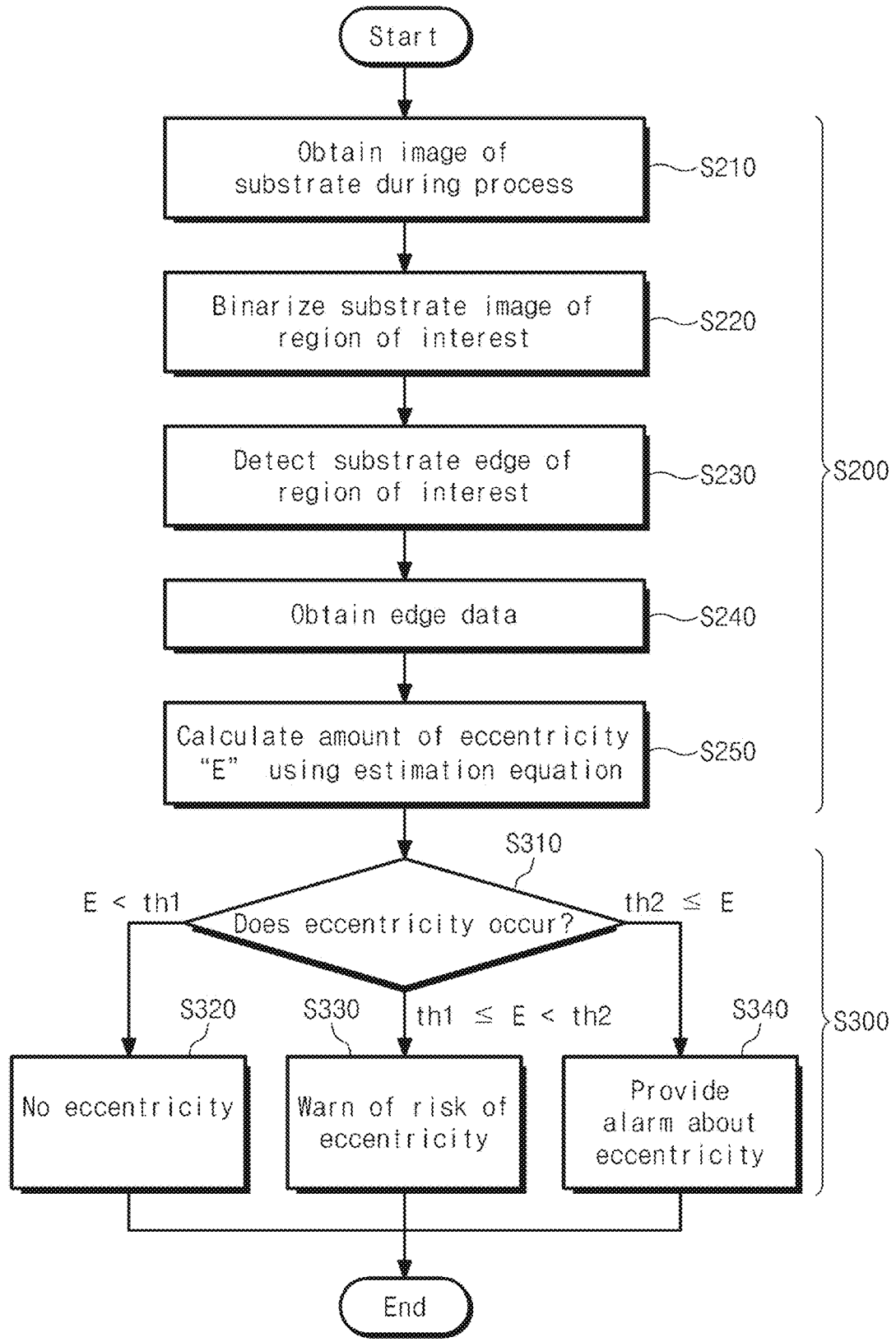
FIG. 19 is a flowchart specifically illustrating steps S200 and S300 illustrated in FIG. 5.

FIG. 18 is a view illustrating a configuration of the eccentricity calculation unit of the eccentricity inspection apparatus according to an embodiment of the inventive concept. FIG. 19 is a flowchart specifically illustrating steps S200 and S300 illustrated in FIG. 5. Referring to FIGS. 3, 18, and 19, the eccentricity calculation unit 434 may include a binarization unit 4342, a second edge detection unit 4344, an edge data acquisition unit 4346, and an eccentricity amount calculation unit 4348.

When a second image of the substrate W supported on the spin chuck of the support unit 340 is obtained by the image acquisition unit 420 during the process, the eccentricity calculation unit 434 receives the second image from the image acquisition unit 420 and sets a region of interest for the second image (S210). The region of interest that is set for the second image may be set to be the same as the region of interest that is set for the first image obtained in the initial normal state in which the spin chuck is not eccentrically located. A process of obtaining second edge data from the region of interest for the second image may be performed in a manner similar to the process of obtaining the first edge data from the first image.

The binarization unit 4322 binarizes the region of interest of the second image to detect the edge of the substrate W (S220). The second edge detection unit 4344 detects the edge of the substrate W in the binarized region of interest of the second image. The edge data acquisition unit 4346 obtains the second edge data of the substrate W from the edge of the substrate W that is detected in the region of interest of the second image (S240). The second edge data may include N pieces of point data (N being an integer of 4 or more). The number of point data of the second edge data may be the same as, or different from, the number of point data of the first edge data.

The eccentricity amount calculation unit 4348 calculates the amount of eccentricity E of the support shaft 348 of the spin chuck by comparing the second edge data obtained from the second image with the estimation equation (S250). The eccentricity amount calculation unit 4348 may calculate the amount of eccentricity E of the spin chuck, based on the difference between the second edge data and the estimation equation.

Figure 20:
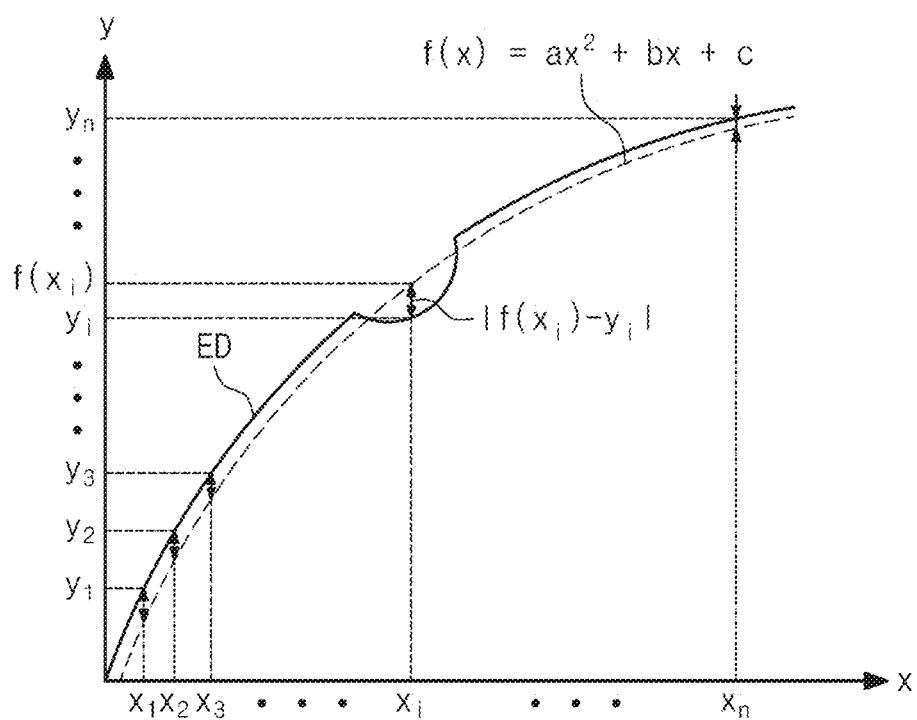
FIG. 20 is a view illustrating a method of calculating the amount of eccentricity of the spin chuck according to an embodiment of the inventive concept.

In an embodiment, the eccentricity amount calculation unit 4348 may calculate the amount of eccentricity E by substituting information regarding the point data of the second edge data into the estimation equation $f(x)=ax^2+bx+c$ that is modeled in the state in which the spin chuck is not eccentrically located. FIG. 20 is a view illustrating a method of calculating the amount of eccentricity of the spin chuck according to an embodiment of the inventive concept. Referring to FIG. 20, the eccentricity amount calculation unit 4348 may calculate the amount of eccentricity E according to Equation 2 below.

$$E = \frac{\sum_{i=1}^{N} |f(x_i) - y_i|}{N} \quad \text{[Equation 2]}$$

In Equation 2, N denotes the number of point data of the second edge data, $y_i$ denotes the y-coordinate of i-th point data of the second edge data, $x_i$ denotes the x-coordinate of the i-th point data of the second edge data, and $f(x_i)$ denotes the function value of the estimation equation that corresponds to the x-coordinate $x_i$ of the i-th point data. All point data of the second edge data, or only some of the point data, may be used to calculate the amount of eccentricity E.

The eccentricity inspection apparatus may determine whether the spin chuck is eccentrically located, based on the amount of eccentricity E calculated. Referring again to FIG. 19, the eccentricity inspection apparatus may compare the amount of eccentricity E of the spin chuck with a first threshold value $th_1$ that is relatively low and a second threshold value $th_2$ that is higher than the first threshold value $th_1$ (S310). When the amount of eccentricity E is less than the first threshold value $th_1$, the eccentricity inspection apparatus may determine that the spin chuck is not eccentrically located (S320). In this case, a process using the spin chuck is able to be performed, and it is unnecessary to check and replace the spin chuck. When the amount of eccentricity E is more than the first threshold value $th_1$ and less than the second threshold value $th_2$, the next process is able to be performed, but it is necessary to check the spin chuck as soon as possible. In this case, the eccentricity inspection apparatus may warn of the risk of eccentricity (S330). When the amount of eccentricity E is more than the second threshold value $th_2$, the eccentricity inspection apparatus may determine that the spin chuck is eccentrically located and may generate an alarm to immediately stop the ongoing process (S340).

According to the embodiments of the inventive concept, the eccentricity inspection apparatus may diagnose an eccentric state of the spin chuck in real time and may accurately predict the time to check or replace the spin chuck. Furthermore, when the spin chuck is eccentrically located, the eccentricity inspection apparatus may perform control with the warning and the alarm, thereby preventing process accidents such as damage to the substrate, damage to the spin chuck, and the like in advance and solving the problem in which due to operation of the eccentrically located spin chuck, particles are scattered and rebounded to contaminate the chamber and cause a defect in the substrate.

Figure 21:
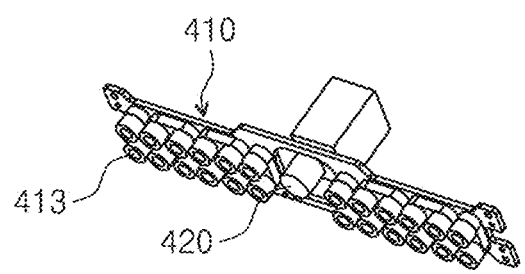
FIG. 21 is a perspective view illustrating a lighting unit of the eccentricity inspection apparatus according to an embodiment of the inventive concept.
Figure 21:
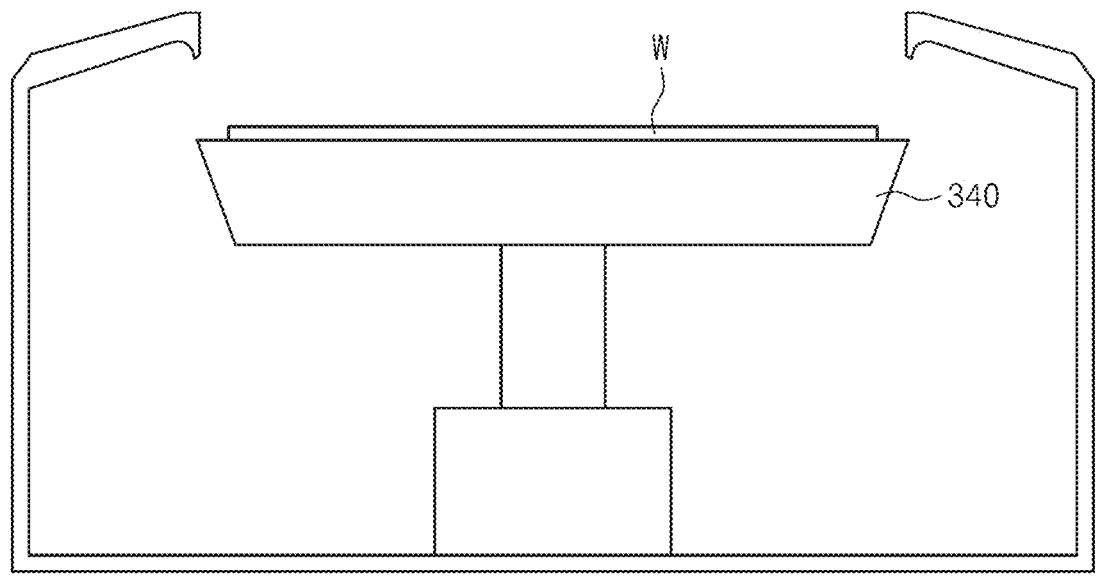
Figure 22:
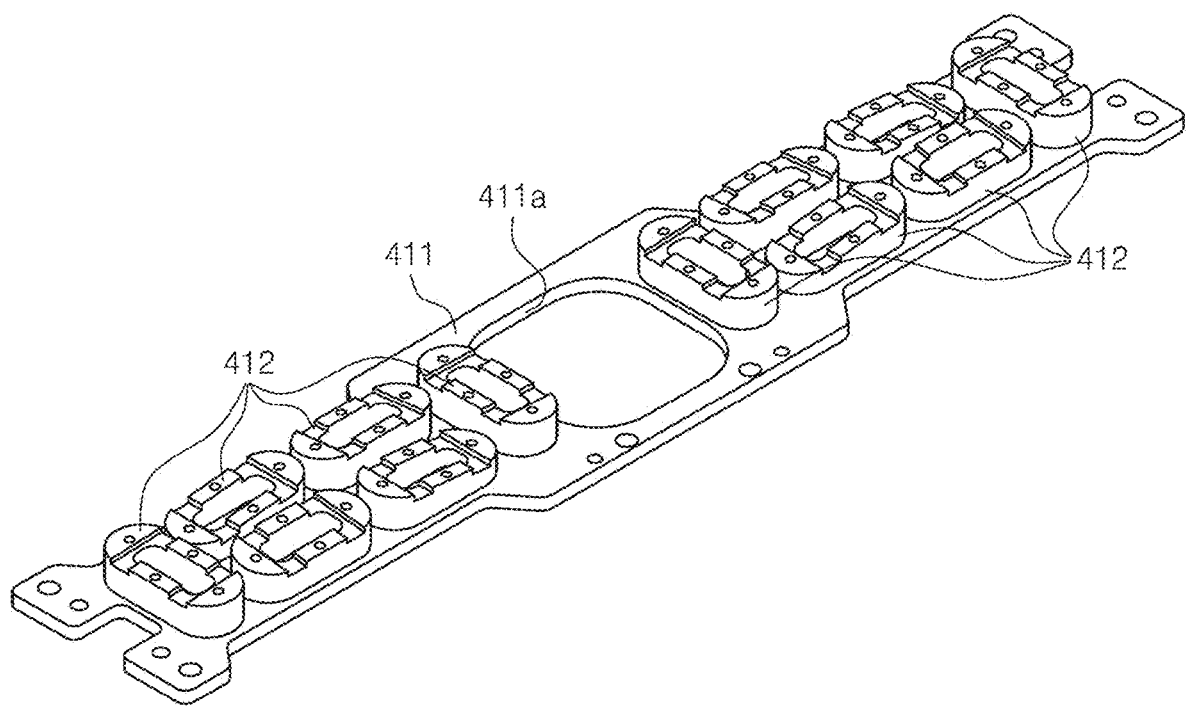
FIG. 22 is an exploded perspective view illustrating the lighting unit of the eccentricity inspection apparatus according to an embodiment of the inventive concept.
Figure 23:
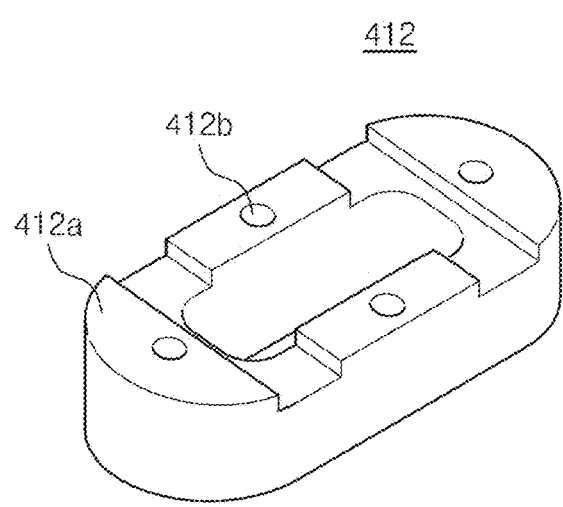
FIG. 23 is a perspective view illustrating a bracket of the eccentricity inspection apparatus according to an embodiment of the inventive concept.
Figure 24:
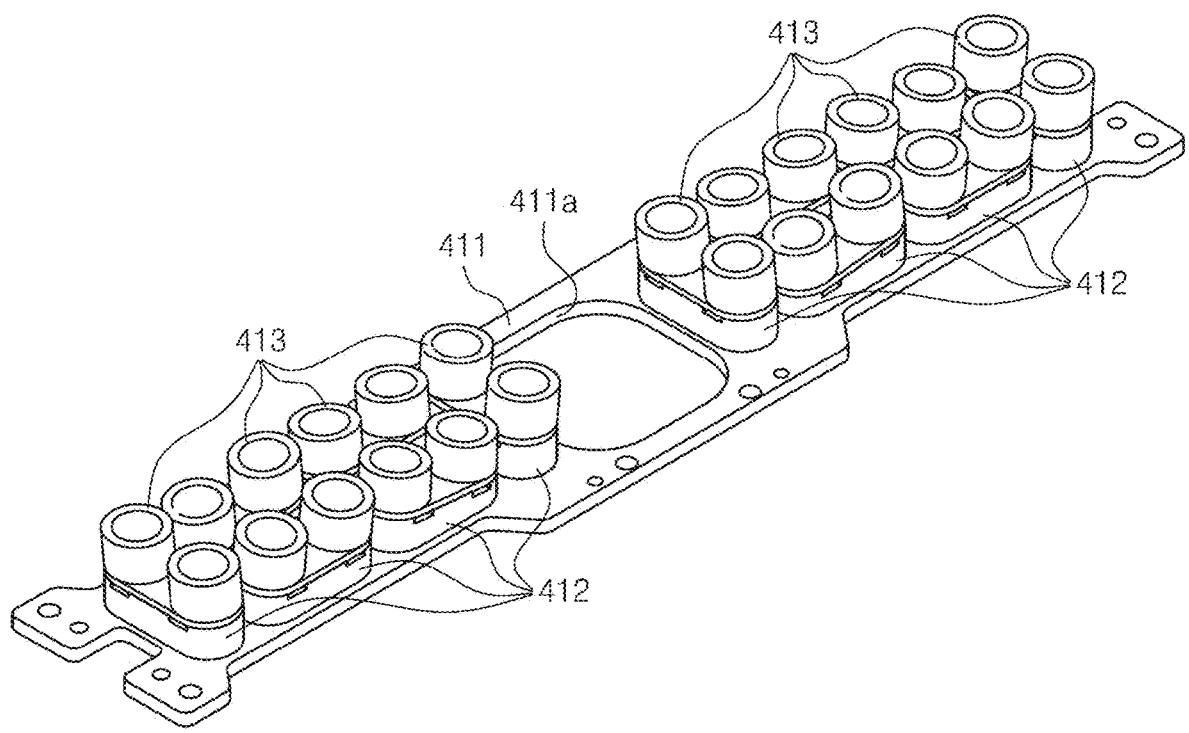
FIG. 24 is a perspective view illustrating a state in which lens-type lamps are coupled to a frame of the lighting unit of the eccentricity inspection apparatus according to an embodiment of the inventive concept.
Figure 25:
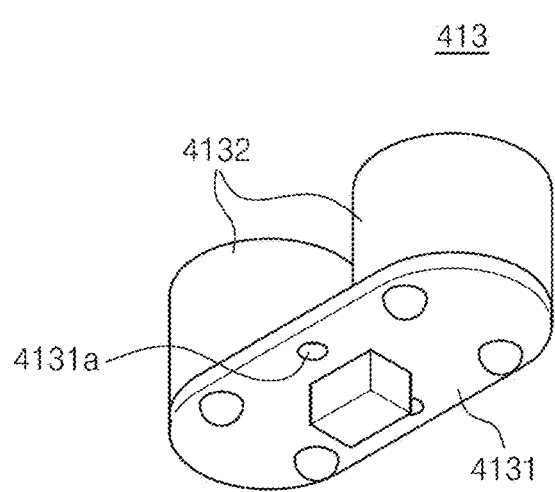
FIG. 25 is a perspective view illustrating the lens-type lamp of the eccentricity inspection apparatus according to an embodiment of the inventive concept.

FIG. 21 is a perspective view illustrating the lighting unit of the eccentricity inspection apparatus according to an embodiment of the inventive concept. FIG. 22 is an exploded perspective view illustrating the lighting unit of the eccentricity inspection apparatus according to an embodiment of the inventive concept. FIG. 23 is a perspective view illustrating a bracket of the eccentricity inspection apparatus according to an embodiment of the inventive concept. FIG. 24 is a perspective view illustrating a state in which lens-type lamps are coupled to a frame of the lighting unit of the eccentricity inspection apparatus according to an embodiment of the inventive concept. FIG. 25 is a perspective view illustrating the lens-type lamp of the eccentricity inspection apparatus according to an embodiment of the inventive concept.

Referring to FIGS. 21 to 25, the lighting unit 410 is designed to supply light along the edge of the substrate W to allow the image acquisition unit 420 to obtain a clear image of the substrate W. To achieve this, the lighting unit 410 includes a frame 411 and a plurality of lens-type lamps 413 mounted on the frame 411 to supply light toward different edge regions of the substrate W in different directions.

The frame 411 may have a substantially flat plate shape. The frame 411 may have, in the center thereof, a mounting hole 411a in which a camera of the image acquisition unit 420 is mounted. A plurality of brackets 412 for mounting the plurality of lens-type lamps 413 may be mounted on the frame 411. The plurality of brackets 412 may be mounted on the frame 411 such that normal lines perpendicular to upper surfaces 412a of the brackets 412 are directed toward different edge regions of the substrate W. The upper surface 412a of at least one bracket 412 may be inclined with respect to the bottom surface thereof. The angle of the upper surface 412a of each bracket 412 may be designed such that the lens-type lamp 143 mounted on the bracket 412 supplies light toward a predetermined edge region of the substrate W. The bracket 412 may have fastening holes (the reference numeral not being illustrated) for mounting the bracket 412 on the frame 411 and coupling holes 412b for coupling the bracket 412 with the lens-type lamp 413.

The lens-type lamp 413 may include a coupling plate 4131 coupled to the upper surface 412a of the bracket 412 and one or more lens-type LEDs 4132 fixed to an upper surface of the coupling plate 4131. In the illustrated embodiment, two lens-type LEDs 4132 are mounted on one coupling plate 4131. However, one, or three or more lens-type LEDs 4132 may be mounted on one coupling plate 4131. The coupling plate 4131 has coupling holes 4131a for coupling the coupling plate 4131 to the bracket 412. Each of the lens-type LEDs 4132 may concentrate light emitted from an LED on an edge region of the substrate W by using a lens provided on an upper side of the lens-type LED 4132 and may adjust the irradiation direction of the light by preventing the light from spreading.

Figure 26:
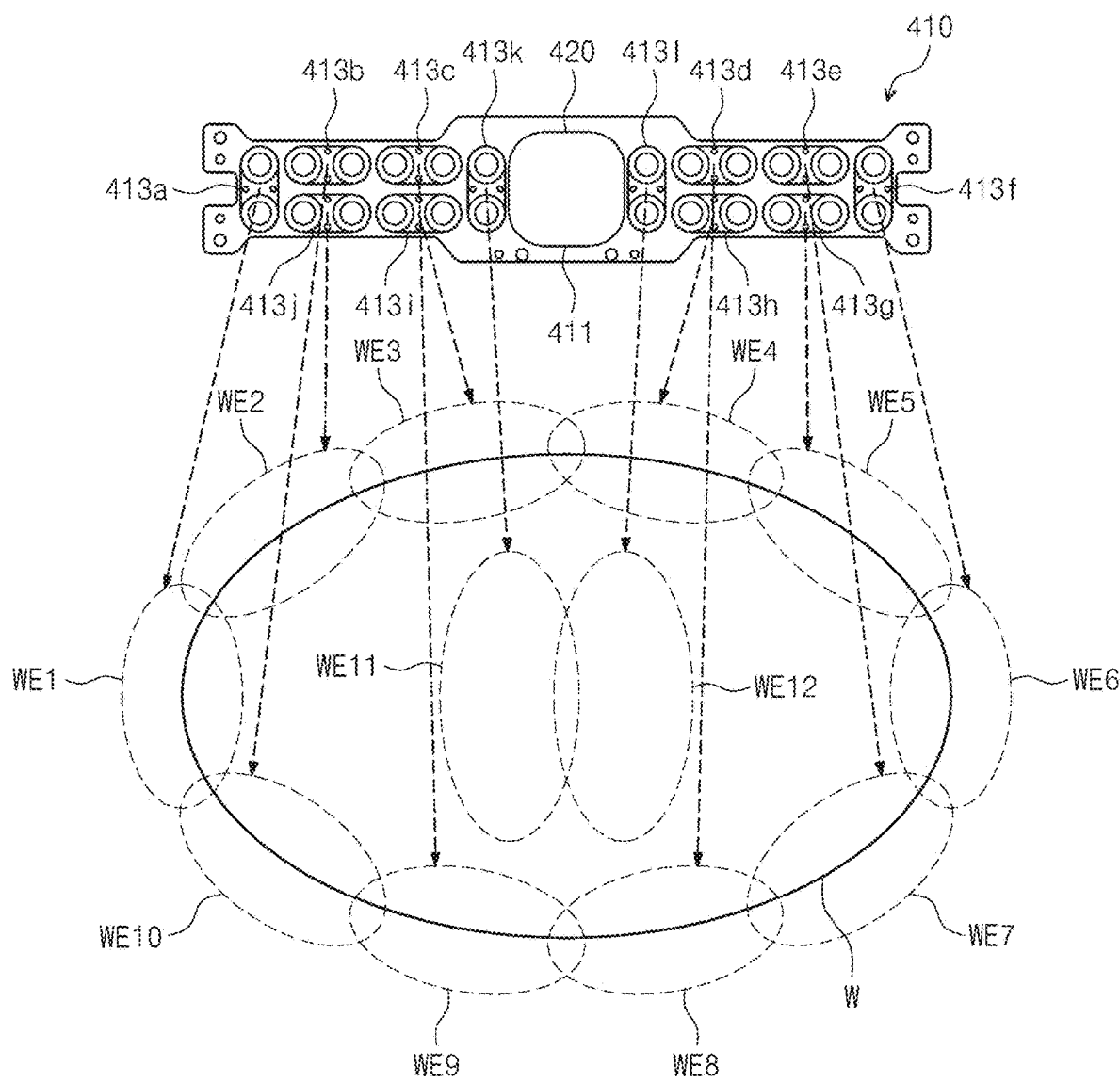
FIG. 26 is a view illustrating a functional effect of the lighting unit of the eccentricity inspection apparatus according to an embodiment of the inventive concept.

FIG. 26 is a view illustrating a functional effect of the lighting unit of the eccentricity inspection apparatus according to an embodiment of the inventive concept. Referring to FIG. 26, the lighting unit 410 may include lens-type lamps 413a to 413j for supplying light along the edge of the substrate W and lens-type lamps 413k and 413l for supplying light to the central portion of the substrate W. The lens-type lamps 413a to 413l may be located in a symmetric arrangement relative to the image acquisition unit 420. The lens-type lamps 413a to 413l may be designed to supply light in mutually symmetric directions relative to the direction in which the image acquisition unit 420 takes an image.

The lens-type lamps 413a to 413j for illuminating the edge, the directions of which are set by the brackets 412, may continuously supply light to lighting regions WE1 to WE10 along the edge of the substrate W. For accurate imaging of the entire edge of the substrate W, the lighting regions WE1 to WE10 illuminated by the lens-type lamps 413a to 413j for illuminating the edge may include an overlapping area therebetween. The lens-type lamps 413k and 413l for illuminating the central portion may illuminate central regions WE11 and WE12 of the substrate W. The light intensity of the lens-type lamps 413a to 413j for illuminating the edge may be designed to be greater than or equal to the light intensity of the lens-type lamps 413k and 413j for illuminating the central portion.

According to an embodiment of the inventive concept, the lens-type lamps 413a to 413j for illuminating the edge supply light to the lighting regions WE1 to WE10 along the edge of the substrate W. Accordingly, a clear image of the edge of the substrate W may be obtained, and the amount of eccentricity of the spin chuck may be accurately estimated. Furthermore, the lens-type lamps 413a to 413l supply light in substantially parallel directions to the direction in which the image acquisition unit 420 takes an image, and the light supplied by the lens-type lamps 413a to 413l is incident on the substrate W in oblique directions. Accordingly, substrate edge information may be prevented from being broken and lost in an image of the substrate W by light that is output by the lens-type lamps 413a to 413l and projected onto the image of the substrate W. In addition, the lens-type lamps 413a to 413l may be designed to supply dark light to the inner portion (the central portion) of the substrate W and brighter light to the edge of the substrate W, and thus the substrate W and the spin chuck may be easily distinguished from each other.

According to the embodiments of the inventive concept, the edge of the substrate W may be prevented from being inaccurately detected due to a variation in color or reflectance according to the characteristics of a film on the substrate W and the shape of a pattern on the substrate W, and the accuracy of eccentricity inspection may be improved by increasing the edge detection rate for the substrate W. Furthermore, by burying the lighting unit 410 and the image acquisition unit 420 in a transparent wall of the chamber, the lighting unit 410 and the image acquisition unit 420 may be prevented from being contaminated by fumes. In addition, the brackets 412 may be detachably coupled to the frame 411. Accordingly, the illumination directions of the lens-type lamps 413 may be adjusted by replacing the brackets 412, and the edge lighting region of the substrate W may be adjusted to correspond to various sizes of the substrate W.

Figure 27:
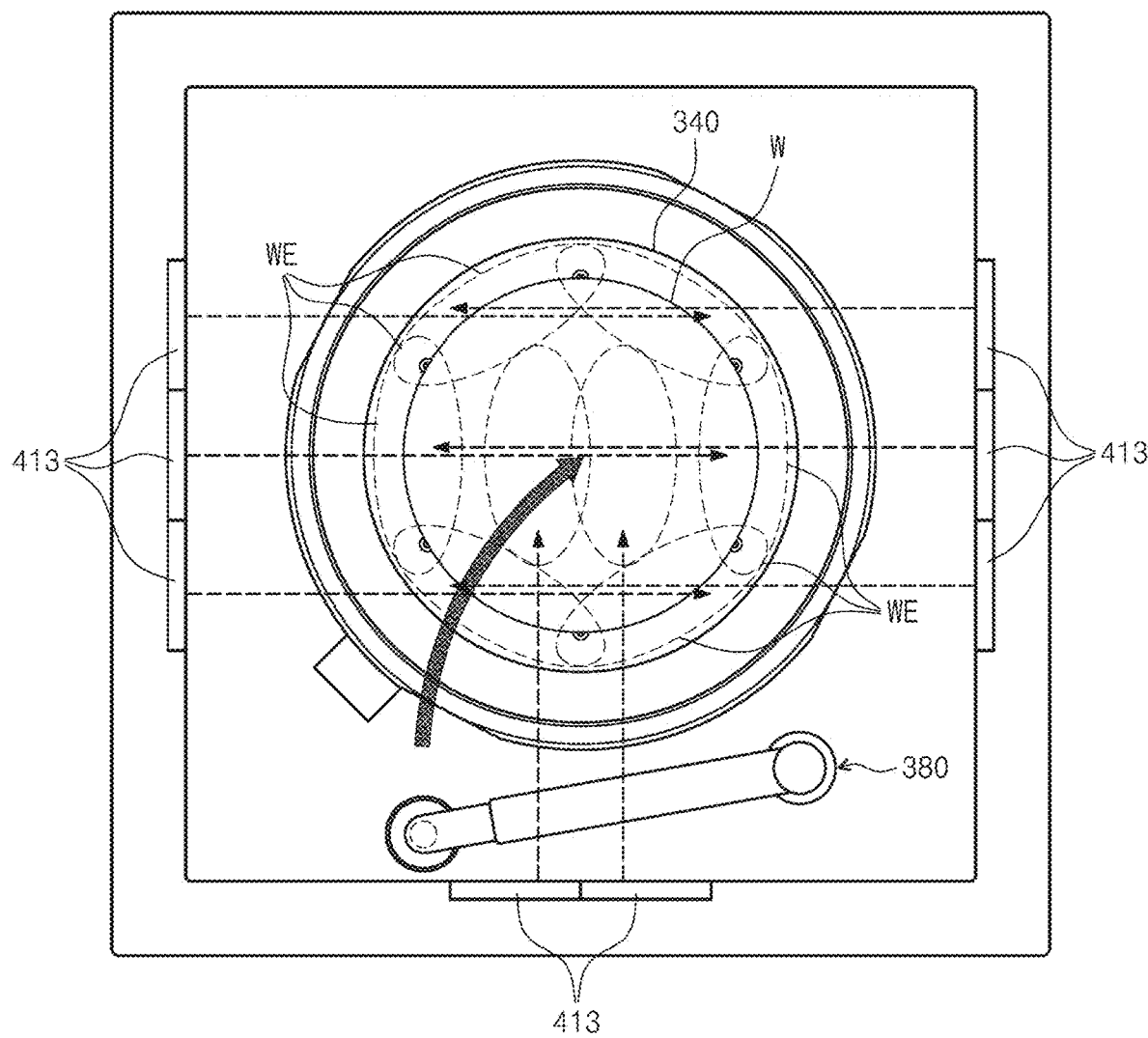
FIG. 27 is a plan view illustrating a lighting unit of an eccentricity inspection apparatus according to another embodiment of the inventive concept.

FIG. 27 is a plan view illustrating a lighting unit of an eccentricity inspection apparatus according to another embodiment of the inventive concept. Referring to FIG. 27, lens-type lamps 413 may be buried in the wall of the chamber to supply light along edge regions WE of a substrate W. In the embodiment of FIG. 27, the lens-type lamps 413 installed on the front side of the chamber may supply light to the central portion of the substrate W, and the lens-types lamps 413 installed on the left and right sides of the chamber may supply light to the edge regions WE of the substrate W. For example, three lens-type lamps 413 installed on the left side of the chamber may supply light to the edge regions WE that are in the 1 o'clock position, the 3 o'clock position, and 5 o'clock position (the front side of the chamber being in the 6 o'clock position), and three lens-type lamps 413 on the right side of the chamber may be installed to be symmetric to the three lens-type lamps 413 on the left side of the chamber and may supply light to the edge regions WE that are in the 7 o'clock position, the 9 o'clock position, and the 11 o'clock position. According to the embodiment of FIG. 27, the lighting unit may supply light appropriate for inspecting the nozzle position of the dispensing member 380 and a dispensed chemical as well as inspecting the eccentricity of the spin chuck.

A nozzle tip has a cylindrical shape, and therefore a shaded region occurs on the nozzle tip having the cylindrical shape when light is supplied in only one direction. However, according to the embodiment of the inventive concept, light may be supplied in various directions, thereby preventing a shaded region on the nozzle and covering the entire region over which the nozzle moves when performing a swing motion. Furthermore, when light is supplied to a transparent chemical in a single direction, the light is partly reflected by the chemical, and the dispensing recognition rate may be deteriorated. However, according to the embodiment of the inventive concept, chemical inspection may also be accurately performed by highlighting the chemical by supplying light to the chemical in various directions, such as 0° and 90°, based on the photographing direction of a camera.

According to the embodiments of the inventive concept, the substrate treating apparatus, the eccentricity inspection apparatus and method, and the recording medium enable accurate measurement of the amount of eccentricity of the spin chuck, which supports and rotates the substrate, based on image processing.

Furthermore, according to the embodiments of the inventive concept, the substrate treating apparatus, the eccentricity inspection apparatus and method, and the recording medium may prevent the amount of eccentricity of the spin chuck from being inaccurately measured due to the notch of the substrate and the chuck pin for supporting the substrate.

In addition, according to the embodiments of the inventive concept, the substrate treating apparatus may provide lighting for accurately measuring the amount of eccentricity of the spin chuck.

In the entire specification, the terminology, component "~unit," refers to a software component or a hardware component such as an FPGA or an ASIC, and performs at least one function or operation. It should be, however, understood that the component "~unit" is not limited to a software or hardware component. The component "~unit" may be implemented in storage media that can be designated by addresses. The component "~unit" may also be configured to regenerate one or more processors.

For example, the component "~unit" may include various types of components (e.g., software components, object-oriented software components, class components, and task components), processes, functions, attributes, procedures, sub-routines, segments of program codes, drivers, firmware, micro-codes, circuit, data, data base, data structures, tables, arrays, and variables. Functions provided by a component and the component "~unit" may be separately performed by a plurality of components and components "~units" and may also be integrated with other additional components.

The method according to the embodiment of the inventive concept may be implemented as a program that can be executed by a computer. The method may be implemented in a generic-purpose digital computer that operates the program using a computer readable recording medium. The computer readable recording medium may be, but is not limited to, a volatile memory such as a static RAM (SRAM), a dynamic RAM (DRAM) or a synchronous DRAM (SDRAM), a non-volatile memory such as a read only memory (ROM), a programmable ROM (PROM), an electrically programmable ROM (EPROM), an electrically erasable and programmable ROM (EEPROM), a flash memory device, a phase-change RAM (PRAM), a magnetic RAM (MRAM), a resistive RAM (RRAM) or a ferroelectric RAM (FRAM), a floppy disk, a hard disk, or an optically readable medium (e.g., a storage medium such as a CD-ROM, a DVD, or the like).

The above description exemplifies the inventive concept. Furthermore, the above-mentioned contents describe exemplary embodiments of the inventive concept, and the inventive concept may be used in various other combinations, changes, and environments. That is, variations or modifications can be made to the inventive concept without departing from the scope of the inventive concept that is disclosed in the specification, the equivalent scope to the written disclosures, and/or the technical or knowledge range of those skilled in the art. The written embodiments describe the best state for implementing the technical spirit of the inventive concept, and various changes required in specific applications and purposes of the inventive concept can be made. Accordingly, the detailed description of the inventive concept is not intended to restrict the inventive concept in the disclosed embodiment state. In addition, it should be construed that the attached claims include other embodiments.

While the inventive concept has been described with reference to exemplary embodiments, it will be apparent to those skilled in the art that various changes and modifications may be made without departing from the spirit and scope of the inventive concept. Therefore, it should be understood that the above embodiments are not limiting, but illustrative.

What is claimed is:

1. A substrate treating apparatus comprising:
    a process chamber having a process space inside;
    a pedestal configured to support a substrate in the process space and to rotate the substrate about a support shaft of a spin chuck; and
    an camera system configured to inspect eccentricity of the support shaft, the eccentricity corresponding to an angle between an axis through a center of the support shaft and a vertical direction perpendicular to the ground,
    wherein the camera system includes,
    a camera configured to obtain an image of the substrate supported on the pedestal, and
    processing circuitry configured to obtain edge data of the substrate from the image of the substrate and measure an amount of eccentricity of the support shaft, based on the edge data.

2. The substrate treating apparatus of claim 1, wherein the processing circuitry is configured to
    receive a first image obtained for the substrate in a state in which the support shaft is not eccentrically located, obtain first edge data of the substrate from the first image, and model an estimation equation for measuring the amount of eccentricity of the support shaft, based on the first edge data, wherein the substrate is supported on the pedestal, and
    to receive a second image obtained for the substrate during a process, obtain second edge data of the substrate from the second image, and measure the amount of eccentricity of the support shaft by comparing the second edge data with the estimation equation, wherein the substrate is supported on the pedestal.

3. The substrate treating apparatus of claim 2, wherein the processing circuitry is further configured to determine the eccentricity by comparing the amount of eccentricity of the support shaft with a set reference value, and to generate a warning when the eccentricity occurs.

4. The substrate treating apparatus of claim 2, wherein the processing circuitry is configured to set a region of interest (ROI) including an edge portion of the substrate in the first image;

to detect an edge of the substrate in the region of interest (ROI) of the first image to obtain the first edge data, and to calculate the estimation equation, based on at least three pieces of point data included in the first edge data.

5. The substrate treating apparatus of claim 4, wherein the region of interest (ROI) includes an upper left edge region or an upper right edge region of the substrate in the first image.

6. The substrate treating apparatus of claim 4, wherein the processing circuitry is configured to obtain three pieces of point data from the first edge data, to estimate a quadratic equation, based on the three pieces of point data, to verify the quadratic equation by calculating an error between the quadratic equation and the first edge data, and to determine a quadratic equation having an error, among quadratic equations obtained by varying the three pieces of point data, to be the estimation equation.

7. The substrate treating apparatus of claim 4, wherein the processing circuitry is configured to to detect an edge of the substrate in a region of interest (ROI) of the second image, to obtain the second edge data from the edge of the substrate that is detected in the region of interest (ROI) of the second image, and to calculate the amount of eccentricity of the support shaft, based on a difference between the second edge data and the estimation equation.

8. The substrate treating apparatus of claim 1, further comprising:

a lighting configured to supply light to the substrate supported on the pedestal, wherein the lighting includes a plurality of lens-type lamps configured to supply the light toward different edge regions of the substrate in different directions, and adjacent regions among the edge regions of the substrate that are illuminated by the lens-type lamps have an overlapping area therebetween.

9. The substrate treating apparatus of claim 8, wherein the lighting further includes a frame and a plurality of brackets mounted on the frame so as to be directed toward the different edge regions of the substrate, and the lens-type lamps are coupled to upper surfaces of the brackets, and the substrate treating apparatus is configured to adjust irradiation directions of the lens-type lamps depending on angles of the upper surfaces of the brackets.

10. An eccentricity inspection apparatus comprising:

a camera system configured to obtain an image of a substrate supported to be rotatable about a support shaft of a spin chuck of a pedestal in a process space of a process chamber and processing circuitry configured to obtain edge data of the substrate from the image of the substrate and measure an amount of eccentricity of the support shaft, based on the edge data, the eccentricity corresponding to an angle between an axis through a center of the support shaft and a vertical direction perpendicular to the ground.

11. The eccentricity inspection apparatus of claim 10, wherein the processing circuitry is configured to receive a first image obtained for the substrate in a state in which the support shaft is not eccentrically located, obtain first edge data of the substrate from the first image, and model an estimation equation for measuring the amount of eccentricity of the support shaft, based on the first edge data, wherein the substrate is supported on the pedestal, and to receive a second image obtained for the substrate during a process, obtain second edge data of the substrate from the second image, and measure the amount of eccentricity of the support shaft by comparing the second edge data with the estimation equation, wherein the substrate is supported on the pedestal.

12. The eccentricity inspection apparatus of claim 11, wherein the processing circuitry is further configured to to determine eccentricity by comparing the amount of eccentricity of the support shaft with a set reference value, and to generate a warning when the eccentricity occurs.

13. The eccentricity inspection apparatus of claim 11, wherein the processing circuitry is configured to obtain three pieces of point data from the first edge data, to estimate a quadratic equation, based on the three pieces of point data, to verify the quadratic equation by calculating an error between the quadratic equation and the first edge data, and to determine a quadratic equation having an error among quadratic equations obtained by varying the three pieces of point data, to be the estimation equation.

14. An eccentricity inspection method comprising:

receiving an image of a substrate supported to be rotatable about a support shaft of a spin chuck of a pedestal in a process space of a process chamber; and obtaining edge data of the substrate from the image and measuring an amount of eccentricity of the support shaft, based on the edge data, the eccentricity corresponding to an angle between an axis through a center of the support shaft and a vertical direction perpendicular to the ground.

15. The eccentricity inspection method of claim 14, wherein the measuring of the amount of eccentricity includes:

determining eccentricity by comparing the amount of eccentricity of the support shaft with a set reference value; and generating a warning when the eccentricity occurs.

16. The eccentricity inspection method of claim 14, wherein the measuring of the amount of eccentricity includes:

receiving a first image obtained for the substrate in a state in which the support shaft is not eccentrically located;

obtaining first edge data of the substrate from the first image;

modeling an estimation equation for measuring the amount of eccentricity of the support shaft, based on the first edge data, wherein the substrate is supported on the pedestal;

receiving a second image obtained for the substrate during a process;

obtaining second edge data of the substrate from the second image; and calculating the amount of eccentricity of the support shaft by comparing the second edge data with the estimation equation, wherein the substrate is supported on the pedestal.

17. The eccentricity inspection method of claim 16, wherein the modeling of the estimation equation includes:
setting a region of interest (ROI) including an edge portion of the substrate in the first image;
obtaining the first edge data by detecting an edge of the substrate in the region of interest (ROI) of the first image; and
calculating the estimation equation, based on at least three pieces of point data included in the first edge data.

18. The eccentricity inspection method of claim 17, wherein the calculating of the estimation equation includes:
obtaining three pieces of point data from the first edge data;
estimating a quadratic equation based on the three pieces of point data;
verifying the quadratic equation by calculating an error between the quadratic equation and the first edge data; and
determining a quadratic equation having an error, among quadratic equations obtained by varying the three pieces of point data, to be the estimation equation.

19. The eccentricity inspection method of claim 18, wherein in determining the quadratic equation having the error to be the estimation equation, the estimation equation is calculated based on three pieces of point data not included in regions that are related to a notch of the substrate and a chuck pin configured to support the substrate, respectively, in the region of interest (ROI) of the first image.

20. The eccentricity inspection method of claim 16, wherein the calculating of the amount of eccentricity of the support shaft includes:
detecting an edge of the substrate in a region of interest (ROI) of the second image;
obtaining the second edge data from the edge of the substrate that is detected in the region of interest (ROI) of the second image; and
calculating the amount of eccentricity of the support shaft, based on a difference between the second edge data and the estimation equation.

* * * * *